(12) United States Patent
Rehman

(10) Patent No.: US 11,706,057 B2
(45) Date of Patent: Jul. 18, 2023

(54) DEVICES, SYSTEMS, AND METHODS FOR SERIAL COMMUNICATION OVER A GALVANICALLY ISOLATED CHANNEL

(71) Applicant: Nunami Inc., San Jose, CA (US)

(72) Inventor: Syed Enam Rehman, Milpitas, CA (US)

(73) Assignee: Nunami Inc., San Jose, CA (US)

( * ) Notice: Subject to any disclaimer, the term of this patent is extended or adjusted under 35 U.S.C. 154(b) by 0 days.

(21) Appl. No.: 17/843,827

(22) Filed: Jun. 17, 2022

(65) Prior Publication Data

US 2022/0407747 A1 Dec. 22, 2022

Related U.S. Application Data

(60) Provisional application No. 63/212,268, filed on Jun. 18, 2021.

(51) Int. Cl.
| | |
|---|---|
| *H04L 25/02* | (2006.01) |
| *H04B 1/38* | (2015.01) |
| *H05K 3/28* | (2006.01) |
| *H01L 23/64* | (2006.01) |
| *H01L 23/495* | (2006.01) |

(52) U.S. Cl.
CPC ........ *H04L 25/0266* (2013.01); *H01L 23/495* (2013.01); *H01L 23/642* (2013.01); *H04B 1/38* (2013.01); *H05K 3/28* (2013.01)

(58) Field of Classification Search
CPC . H04L 25/0266; H01L 23/495; H01L 23/642; H01L 23/552; H01L 23/66; H01L 25/0655; H04B 1/38; H05K 3/28; H05K 1/0231; H05K 1/162; H05K 1/0245; H05K 1/0298
See application file for complete search history.

(56) References Cited

U.S. PATENT DOCUMENTS

| | | |
|---|---|---|
| 6,683,548 B2 | 1/2004 | Scott et al. |
| 6,728,328 B1 | 4/2004 | Ellsworth |
| 7,154,940 B2 | 12/2006 | Scott et al. |

(Continued)

OTHER PUBLICATIONS

International Search Report and Written Opinion for corresponding International Patent Application No. PCT/US2022/034093, dated Sep. 2, 2022.

(Continued)

*Primary Examiner* — Dac V Ha
(74) *Attorney, Agent, or Firm* — Loza & Loza, LLP

(57) ABSTRACT

Devices, systems, and methods for serial communication over a galvanically isolated channel are disclosed. A device includes a first IC device interface, first IO components connected to the first IC device interface, a second IC device interface, second IO components connected to the second IC device interface, an insulator layer having a first major surface and a second major surface, at least one pair of capacitor plates and corresponding interconnection paths on the first major surface, and at least one pair of capacitor plates and corresponding interconnection paths on the second major surface, wherein the at least one pair of capacitor plates on the first major surface of the insulator layer are aligned with the at least one pair of capacitor plates on the second major surface of the insulator layer to form at least one pair of capacitors.

16 Claims, 30 Drawing Sheets

(56) References Cited

U.S. PATENT DOCUMENTS

| | | |
|---|---|---|
| 7,468,547 B2 | 12/2008 | Harvey |
| 7,483,274 B2 | 1/2009 | Ruizenaar et al. |
| 7,821,428 B2 | 10/2010 | Leung et al. |
| 10,446,498 B2 | 10/2019 | Constantino et al. |
| 10,972,323 B2 | 4/2021 | Rehman et al. |
| 11,342,288 B2 * | 5/2022 | Briano ................ H04B 5/0012 |
| 2007/0080587 A1 | 4/2007 | Ruizenaar et al. |
| 2009/0206960 A1 | 8/2009 | Ng et al. |
| 2009/0213914 A1 | 8/2009 | Dong et al. |
| 2010/0054345 A1 | 3/2010 | Yamamoto |
| 2013/0037909 A1 | 2/2013 | French et al. |
| 2013/0316646 A1 * | 11/2013 | Steeneken ............... H01L 28/60 |
| | | 257/532 |
| 2019/0067171 A1 | 2/2019 | Estacio et al. |
| 2019/0081133 A1 * | 3/2019 | Cook .................... H01L 23/642 |
| 2019/0237394 A1 * | 8/2019 | Wang ................ H01L 23/49589 |
| 2020/0136869 A1 | 4/2020 | Rehman et al. |
| 2020/0266817 A1 | 8/2020 | Muellauer et al. |
| 2020/0312794 A1 | 10/2020 | West et al. |

OTHER PUBLICATIONS

Texas Instruments, "ISO14xx 5-kVRMS Isolated RS-485/RS-422 Transceiver with Robust EMC", SLLSF22G—Apr. 2018-REVISED Jun. 2020, 49 pgs.

Silicon Labs, "Si86XX CMOS Digital Isolator-Based Serial Interface User's Guide", Si86xxCOM-EVB, Rev. 0.1 Apr. 2015, 2015, 16 pgs.

* cited by examiner

*1600A*

*1600B*

DEVICES, SYSTEMS, AND METHODS FOR SERIAL COMMUNICATION OVER A GALVANICALLY ISOLATED CHANNEL

BACKGROUND

Galvanic isolation is an essential building block for serial communication in many automotive, industrial, and power systems. Galvanic isolation for serial communication is a complex problem because system designers must ensure isolation safety under extreme conditions that may result from electrical or thermal stress in the field. Manufacturers must guarantee isolation performance against various degradations caused by aging, contamination, or other manufacturing defects. Therefore, there is a need for devices that efficiently and reliably enable serial communication over a galvanically isolated channel.

SUMMARY

Devices, systems, and methods for serial communication over a galvanically isolated channel are disclosed. In an embodiment, a device for galvanic isolation includes a first integrated circuit (IC) device interface, first input/output components connected to the first IC device interface, a second IC device interface, second input/output components connected to the second IC device interface, an insulator layer having a first major surface and a second major surface, at least one pair of capacitor plates and corresponding interconnection paths on the first major surface, wherein the interconnection paths are electrically connected to the first IC device interface by plate-specific vias, and at least one pair of capacitor plates and corresponding interconnection paths on the second major surface, wherein the interconnection paths are electrically connected to the second IC device interface by plate-specific vias, wherein the at least one pair of capacitor plates on the first major surface of the insulator layer are aligned with the at least one pair of capacitor plates on the second major surface of the insulator layer to form at least one pair of capacitors.

In an embodiment, the first input/output components are connected to the first IC device interface by vias, and the second input/output components are connected to the second IC device interface by vias.

In an embodiment, a first ground plate separated from the at least one pair of capacitor plates and corresponding interconnection paths on the first major surface by a protective shield insulator layer, and connected to the first IC device interface, and a second ground plate separated from the at least one pair of capacitor plates and corresponding interconnection paths on the second major surface by a protective shield insulator layer, and connected to the second IC to device interface.

In an embodiment, the first IC device interface is on a first side of a top surface of the device and the second IC device interface is on a second side of the top surface of the device, and wherein the first side of the device is opposite the second side of the device.

In an embodiment, the first IC device interface and the first input/output components are on opposite surfaces of the device, and the second IC device interface and the second input/output components are on opposite surfaces of the device.

In an embodiment, the first IC device interface and second IC device are on the same surface of the device, and the first input/output components and the second input/output components are on the same surface of the device.

In an embodiment, the first IC device interface and the second IC device are on a top surface of the device, and the first input/output components and the second input/output components are on a bottom surface of the device.

Another embodiment of a device for galvanic isolation is disclosed. The device includes a first IC device interface, first input/output components connected to the first IC device interface, a second IC device interface, second input/output components connected to the second IC device interface, an insulator layer having a first major surface and a second major surface, at least one pair of conductive elements and corresponding interconnection paths on the first major surface, wherein the interconnection paths are electrically connected to the first IC device interface by plate-specific vias, and at least one pair of conductive elements and corresponding interconnection paths on the second major surface, wherein the interconnection paths are electrically connected to the second IC device interface by plate-specific vias, wherein the at least one pair of conductive elements on the first major surface of the insulator layer are aligned with the at least one pair of conductive elements on the second major surface of the insulator layer to form at least one pair of couplers.

In an embodiment, the at least one pair of conductive elements on the first major surface is a pair of inductive loops, and the at least one pair of conductive elements on the second major surface is a pair of inductive loops.

In an embodiment, the first IC device interface and the second IC device are on a top surface of the device, and the first input/output components and the second input/output components are on a bottom surface of the device.

In an embodiment, the first input/output components are connected to the first IC device interface by vias, and the second input/output components are connected to the second IC device interface by vias.

In an embodiment, a first ground plate separated from the at least one pair of conductive elements and corresponding interconnection paths on the first major surface by a protective shield insulator layer, and connected to the first IC device interface, and a second ground plate separated from the at least one pair of conductive elements and corresponding interconnection paths on the second major surface by a protective shield insulator layer, and connected to the second IC device interface.

In an embodiment, the first IC device interface is on a first side of a top surface of the device and the second IC device interface is on a second side of the top surface of the device, and the first side of the device is opposite the second side of the device.

In an embodiment, the first IC device interface and the first input/output components are on opposite surfaces of the device, and the second IC device interface and the second input/output components are on opposite surfaces of the device.

In an embodiment, the first IC device interface and the second IC device are on the same surface of the device, and the first input/output components and the second input/output components are on the same surface of the device.

A system for serial communication is disclosed. The system includes a galvanic isolation device, a first IC device connected to the galvanic isolation device, and a second IC device connected to the galvanic isolation device, wherein the galvanic isolation device includes first input/output components connected to the first IC device, second input/output components connected to the second IC device, an insulator layer having a first major surface and a second major surface, at least one pair of conductive elements and corresponding interconnection paths on the first major surface, wherein the interconnection paths are electrically connected to the first IC device by plate-specific vias, and at least one pair of conductive elements and corresponding interconnection paths on the second major surface, wherein the interconnection paths are electrically connected to the second IC device by plate-specific vias, wherein the at least one pair of conductive elements on the first major surface of the insulator layer are aligned with the at least one pair of conductive elements on the second major surface of the insulator layer to form at least one pair of couplers.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
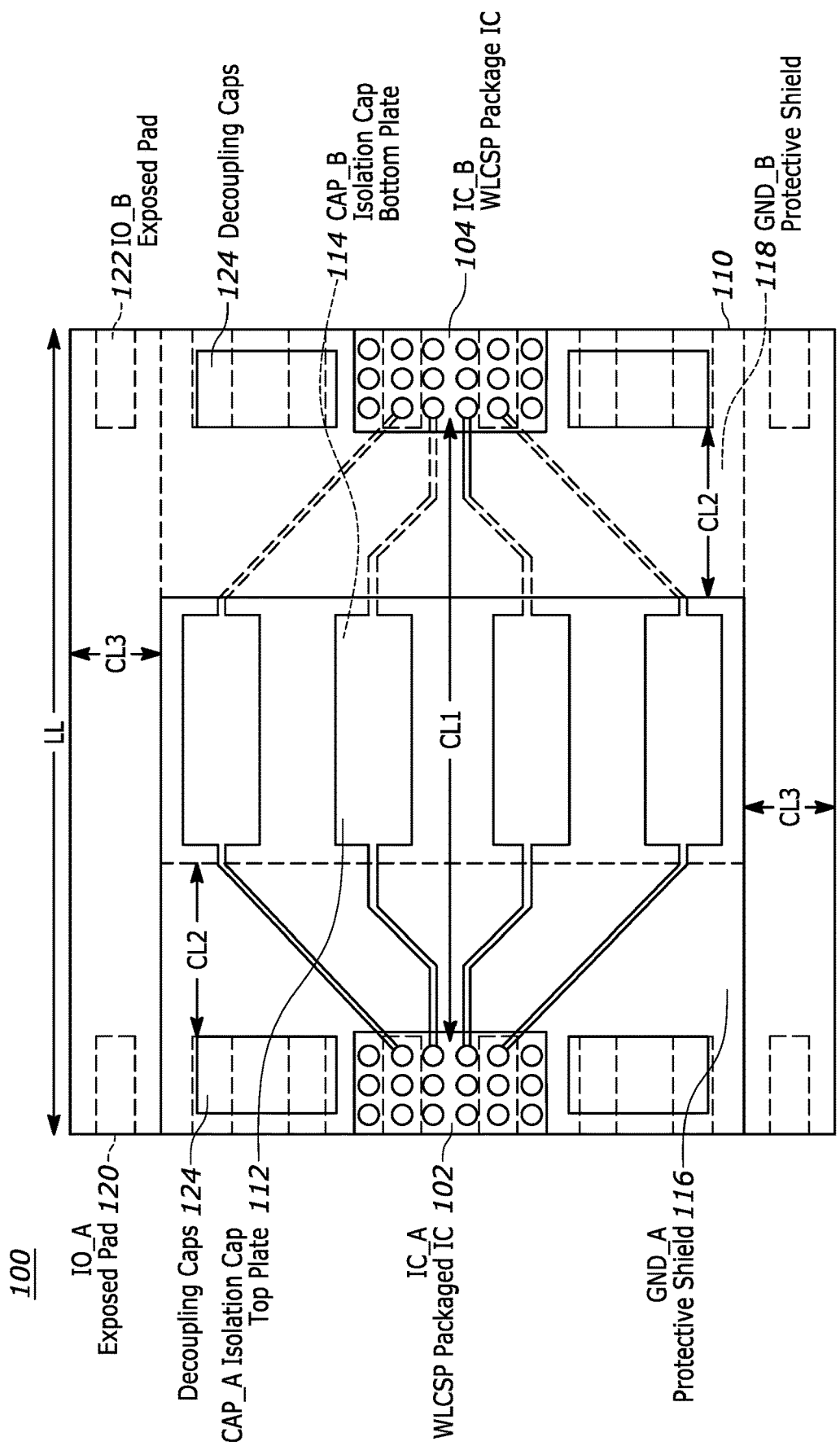
FIG. 1 depicts a top view of the physical structure of an example of a galvanically isolated communication system.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Digital isolators have gained popularity in recent years with the growing demand for safety isolation in automotive and industrial applications. Digital isolators transmit high-frequency RF signals between transceivers instead of optocouplers that were traditionally used as isolators. Emerging automotive and industrial applications require higher data rates across a wider temperature range and longer life. Digital isolators manufactured using solid-state semiconductors can address these challenges more efficiently than optocouplers and can provide consistent performance across a broader temperature range with higher data rates. Additionally, digital isolators can be less susceptible to age-based degradation than optocouplers.

Some conventional digital isolators use a thin dielectric insulator to couple RF signals with a much lower distance through insulation (also known as "DTI") than typically what was used in optocouplers. The transceivers and the insulator are integrated inside a package with limited internal clearance distance between the two isolated interfaces. The insulator and the transceiver are often integrated on the same substrate, making the isolator vulnerable to electrical overstress in the field that can damage the insulator. A short distance through insulation and internal clearance distance can limit the intrinsic reliability of digital isolators. Various mitigation techniques may be included in the manufacturing process and the system-level design to overcome such limitations, which may increase complexity and can result in poor efficiency in the overall solution.

As disclosed herein, a new configuration of a device for galvanically isolated communication is provided that uses external isolated channels for serial communication. In an embodiment, a device for galvanic isolation includes a first integrated circuit (IC) device interface, first input/output (IO) components connected to the first IC device interface, a second IC device interface, second IO components connected to the second IC device interface, an insulator layer having a first major surface and a second major surface, at least one pair of capacitor plates and corresponding interconnection paths on the first major surface of the insulator layer, wherein the interconnection paths are electrically connected to the first IC device interface by plate-specific vias, and at least one pair of capacitor plates and corresponding interconnection paths on the second major surface of the insulator layer, wherein the interconnection paths are electrically connected to the second IC device interface by plate-specific vias, wherein the at least one pair of capacitor plates on the first major surface of the insulator layer are aligned with the at least one pair of capacitor plates on the second major surface of the insulator layer to form at least one pair of capacitors. Two IC devices (e.g., two transceiver IC devices) can be attached to the IC device interfaces to produce a serial communications system in which the two IC devices are galvanically isolated from each other. Although the two IC devices are attached to the device to produce a galvanically isolated serial communications system, the device is not in the same package as the transceiver IC devices. An external isolated channel as provided through such a device, which is not co-packaged with the transceiver integrated circuits, is not limited by package constraints and provides flexibility for optimizing clearance distance and insulator thickness for high intrinsic reliability of the galvanically isolated serial communications system. Furthermore, the device may include a protective shield around the galvanically isolated channels to protect against environmental effects and suppress electromagnetic emissions and noise.

FIG. 1 depicts a top view of the physical structure of an example of a galvanically isolated communication system 100. The system includes IC_A WLCSP packaged IC 102, IC_B WLCSP packaged IC 104, and a device 110 for galvanic isolation that includes CAP_A isolation capacitor top plate 112, CAP_B isolation capacitor bottom plate 114, GND_A protective shield 116, GND_B protective shield 118, IO_A exposed pads 120, IO_B exposed pads 122, and decoupling capacitors 124.

The system as shown in FIG. 1 enables full-duplex communication over a galvanically isolated channel for safety-critical applications. The system shown in FIG. 1 includes two integrated circuits, IC_A 102 and IC_B 104 that are mounted on a galvanic isolation device formed from a printed circuit board and the two integrated circuit devices, IC_A and IC_B, are separated on the device by a clearance distance CL1. In the example of FIG. 1, integrated circuit devices, IC_A and IC_B, are packaged in Wafer Level Chip Scale Package (WLCSP) to minimize area and cost overhead and are attached to the device at respective IC device interfaces, although other package types are possible.

In the example of FIG. 1, the two IC devices, IC_A 102 and IC_B 104, are coupled together through four isolation capacitors (e.g., two pairs of isolation capacitors) for bidirectional communication such that two isolation capacitors (e.g., one pair of isolation capacitors) are used to couple a separate differential signal in each direction (full duplex communication). IC_A and IC_B each include a transceiver for transmitting and receiving a high-frequency signal through the isolation capacitors. In an embodiment, each isolation capacitor is formed by overlapping CAP_A and CAP_B metal plates 112 and 114 that are printed on a printed circuit board. Each CAP_A plate is connected to a terminal on IC_A at a first IC device interface and each CAP_B plate is connected to a terminal on IC_B at a second IC device interface. The CAP_A plates, CAP_B plates, the dielectric insulator between the CAP_A and CAP_B plates, the interconnections between the CAP_A plates and the IC_A integrated circuit, and the interconnections between CAP_B plates and IC_B integrated circuit of the device form an external isolation network. The device that forms the external isolation network is not co-packaged with IC_A and IC_B. That is, IC_A, IC_B, and the device that forms the isolation network are not required to be mounted on any package lead-frame or required to be enclosed in a molded package body. The device that forms the external isolation network is not limited by package constraints, allowing for expanded clearance distances, e.g., distances CL1, CL2, and CL3 that conventionally may limit the reliability and strength of a safety isolation.

In an embodiment, ground plates, GND_A 116 and GND_B 118, are printed metal plates on the circuit board that form a protective shield around the external isolation network. GND_A and GND_B plates can prevent damage to isolation capacitors from environmental exposure. GND_A and GND_B plates can also limit interference in communication from noise and suppress electromagnetic emissions from the isolation network. In an embodiment, the area of the GND_A plate extends beyond the coverage area of all CAP_A plates and the interconnects between IC_A and CAP_A plates. Likewise, the area of the GND_B plate extends beyond the coverage area of all CAP_B plates and the interconnects between IC_B and CAP_B plates. The distance CL3 as shown in FIG. 1 between the edges of GND_A and GND_B plates and the edge of the printed circuit board ensures a minimum clearance distance between GND_A and GND_B plates.

In an embodiment, IO_A 120 and IO_B 122 (where "IO" is short for Input/Output) are printed metal plates on the printed circuit board that are exposed to provide electrical connectivity to IC_A 102 and IC_B 104, respectively, from external devices and/or systems. For example, IO_A and IO_B include conductive pads that are exposed at the bottom surface of the device to enable the device to be connected to external components and/or systems. The IO_A and IO_B conductive pads may provide connectivity for IO signals and for other functions such as power supply and ground. The distance CL2 as shown in FIG. 1 ensures clearance between edges of GND_A, IC_A and IO_A, and edges of GND_B, IC_B and IO_B, respectively. Alternatively, through hole vias can be used on the edge of the printed circuit board for installing pin headers.

The physical size, shape, and layout of CAP_A and CAP_B plates 112 and 114 for each isolation capacitor can be optimized for improving coupling and reducing losses from parasitic capacitance. The physical size, shape, and layout of GND_A and GND_B plates 116 and 118 can also be optimized for achieving a low impedance reference plane for over and under lying circuit components.

In the embodiment of FIG. 1, the four decoupling capacitors 124 can be mounted on top of the printed circuit board, preferably close to exposed pads for power supply and ground to mitigate noise in the power supply to IC_A 102 and IC_B 104 integrated circuits. Although the system of FIG. 1 includes decoupling capacitors, other embodiments may not include such decoupling capacitors.

Figure 2A:
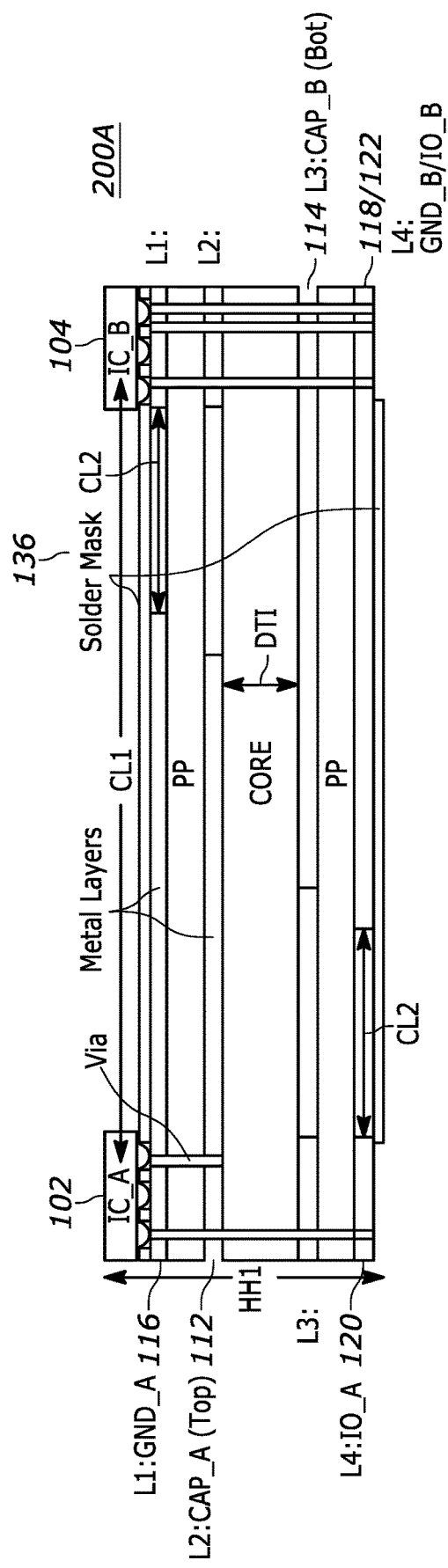
FIG. 2A depicts a cross-sectional view of the physical structures of a galvanically isolated communication system that includes a 4-layer printed circuit board configuration.
Figure 2B:
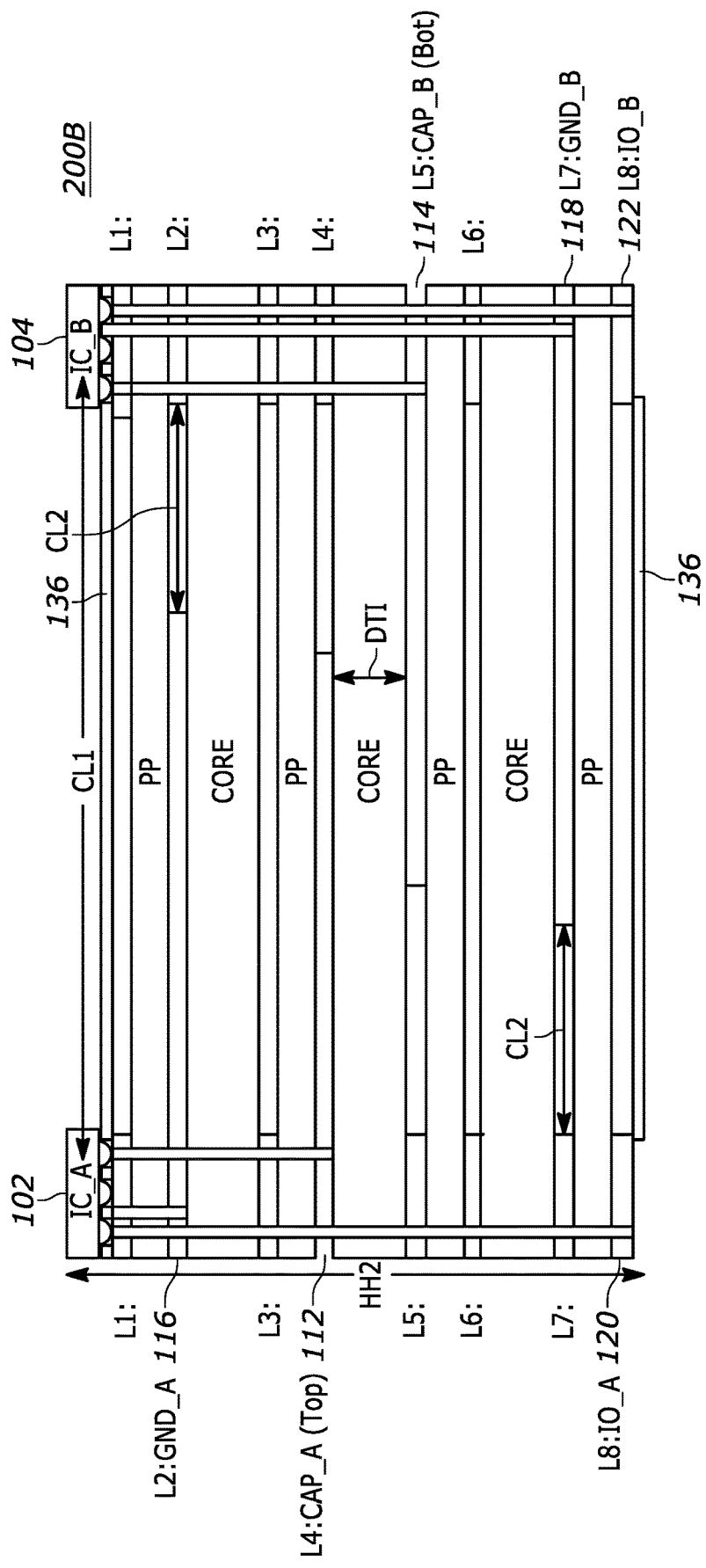
FIG. 2B depicts a cross-sectional view of the physical structures of a galvanically isolated communication system that includes an 8-layer printed circuit board configuration.

FIGS. 2A and 2B depict cross-sectional views 200A and 200B of the physical structures of two galvanically isolated communication systems that include galvanic isolation devices implemented in 1) a 4-layer printed circuit board configuration (FIG. 2A) and 2) an 8-layer printed circuit board configuration (FIG. 2B). The device in view 200A of FIG. 2A includes ground plate A 116 (GND_A) at layer 1 (L1), top capacitor plates 112 (CAP_A) at layer 2 (L2), bottom capacitor plates 114 (CAP_B) at layer 3 (L3), input/output interfaces 120 and 122 (IO_A and IO_B) and ground plate B 118 (GND_B) at layer 4 (L4), where a first prepeg (PP) layer is between L1 and L2, a core layer (CORE) is between L2 and L3, and a second PP layer is between L3 and L4. Prepreg (PP) layers are known in the field of printed circuit boards and may be referred to herein protective shield insulator layers.

The device in view 200B of FIG. 2B includes ground plate A 116 (GND_A) at layer 2 (L2), top capacitor plates 112 (CAP_A) at layer 4 (L4), bottom capacitor plates 114 (CAP_B) at layer 5 (L5), ground plate B 118 (GND_B) at layer 7 (L7), and input/output interfaces 120 and 122 (IO_A and IO_B) at layer 8 (L8), where a first PP layer is between L1 and L2, an upper core layer (CORE) is between L2 and L3, a second PP layer is between L3 and L4, a central core layer (insulator layer, CORE) is between L4 and L5, a third PP layer is between L5 and L6, a lower core layer (CORE) is between L6 and L7, a fourth PP layer is between L7 and L8.

With regard to FIG. 2A, IC_A 102 and IC_B 104 are mounted on top of the device at respective IC device interfaces with their terminals directly connecting to the top-most printed metal layer that forms at least part of the corresponding IC device interfaces. In an embodiment, the IO_A 120 and IO_B 122 are exposed pads at the bottom surface of the device that are printed on the bottom-most metal layer of the circuit board and connect to IC_A and IC_B, respectively, through metal vias 130, e.g., vertical metal vias that are exposed at a top surface of the device for electrical connection to the IC devices, IC_A and IC_B.

IC_A 102 and IC_B 104 are coupled together through the isolation capacitors formed by overlapping metal plates CAP_A 112 and CAP_B 114. CAP_A and CAP_B plates are printed as two inner metal layers of the circuit board separated by an insulator (also referred to as a core, core layer, or dielectric layer). The thickness of the insulator (CORE) between the CAP_A and CAP_B plates is measured as distance DTI (Distance Through Insulator), which is important for the strength and reliability of safety isolation. In an embodiment, the configuration of the device as described herein provides the flexibility for optimizing the DTI and coupling capacitance by adjusting the thickness of the insulator layer (e.g., the core layer) on the printed circuit board. In an embodiment, the CAP_A and CAP_B plates are connected to IC_A and IC_B, respectively, through metal traces (shown in FIGS. 6A and 7A) at the respective metal layers and vias 132, e.g., vertical metal vias that connect to the metal traces and are exposed at a top surface of the device for electrical connection to the respective IC devices, IC_A and IC_B.

The GND_A 116 protective shield is printed as a metal layer on a PP layer or additional core layer (CORE) above the CAP_A metal layer 112 and the GND_B protective shield 118 is printed as a metal layer on a PP layer or additional core layer below the CAP_B metal layer 114. In an embodiment, the GND_A and GND_B plates are connected to IC_A 102 and IC_B 104, respectively, through vias 134. Note that the via between GND_A and IC_A is not visible in the view of FIG. 2A. In the 4-layer implementation (FIG. 2A), the printed circuit board includes a core layer and two PP layers and in the 8-layer implementation (FIG. 2B), the printed circuit board includes a central core layer (insulation layer) that separates the capacitor plates, CAP_A and CAP_B, two additional core layers, and two PP layers. The distance between GND_A and CAP_A metal layers and the distance between the GND_B and CAP_B metal layers (e.g., as set by the respective intervening PP layers and additional core layers) are greater than DTI in 8-layer implementation (FIG. 2B), which may result in better coupling between IC_A and IC_B than the 4-layer implementation (FIG. 2A).

Various materials as are known in the field can be used in the printed circuit board of the device 110 such as FR4 and Ceramic to form the dielectric layer (e.g., insulator layer or core layer) and/or PP layers. Similar configurations can be realized with varying number of layers and thicknesses. IC_A and IC_B can also be mounted on opposite sides of the printed circuit board (e.g., the top and the bottom) to reduce the overall area without reducing the clearance distances CL1 and CL2.

In an example, the clearance distance CL1 depicted in FIGS. 1, 2A, and 2B can be in the range of 4 mm to 15 mm, the clearance distance CL2 can be in the range of 1 mm to 6 mm, and the clearance distance CL3 can be in the range of 0.5 mm to 3 mm. The distance through insulation, depicted as DTI in FIGS. 2A and 2B, can be, for example, in the range of 0.2 mm to 1 mm.

In an embodiment, the devices shown in FIGS. 2A and 2B also include solder mask layers 136 on the top surface and on the bottom surface of the device. In the example of FIG. 2A, the 4-layer printed circuit board configuration is 1.0 mm thick and in the example of FIG. 2B, the 8-layer printed circuit board configuration is 2.4 mm thick, although other thicknesses are possible.

Figure 3A:
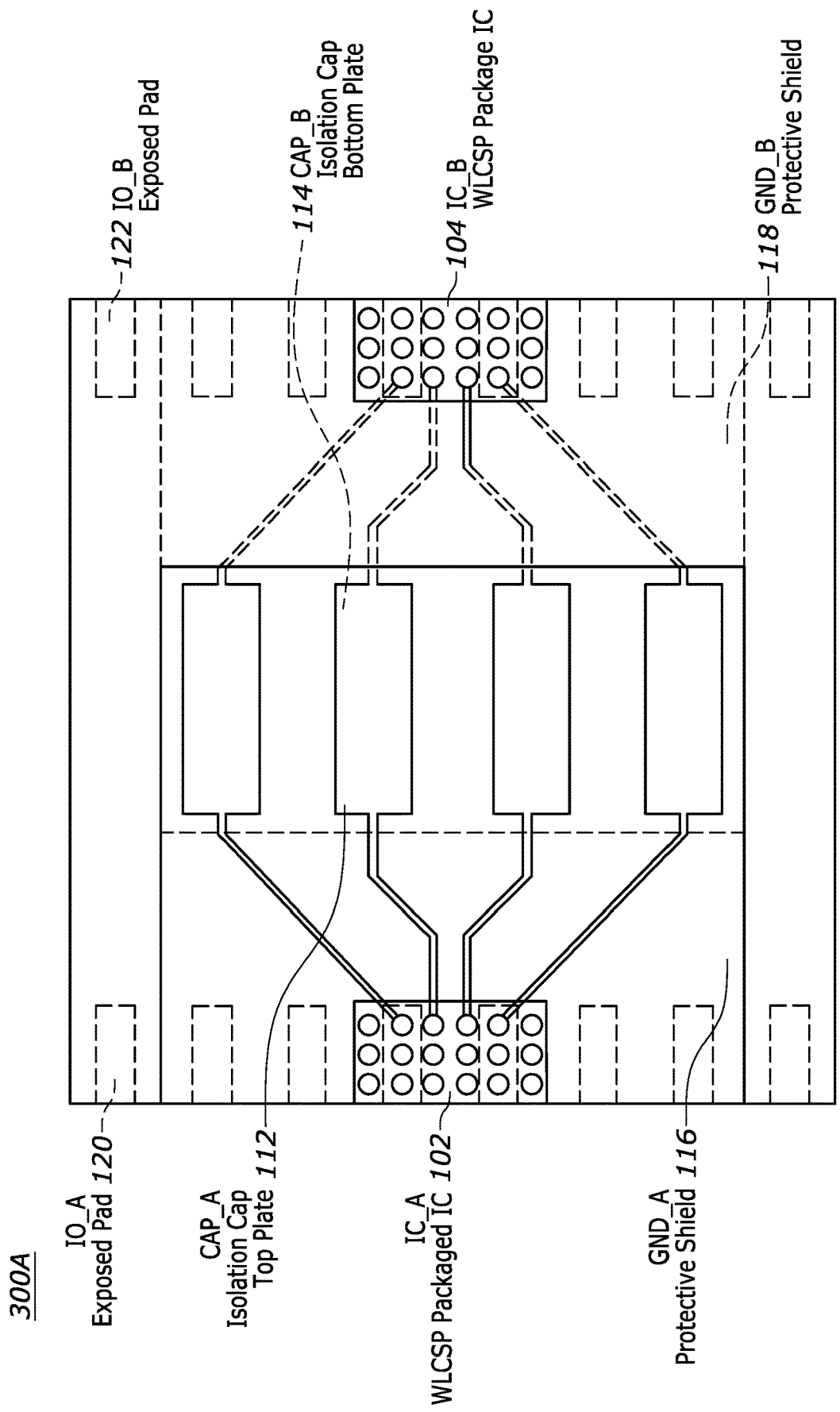
FIG. 3A depicts a top view of components in the physical structure of the isolated communication system.
Figure 3B:
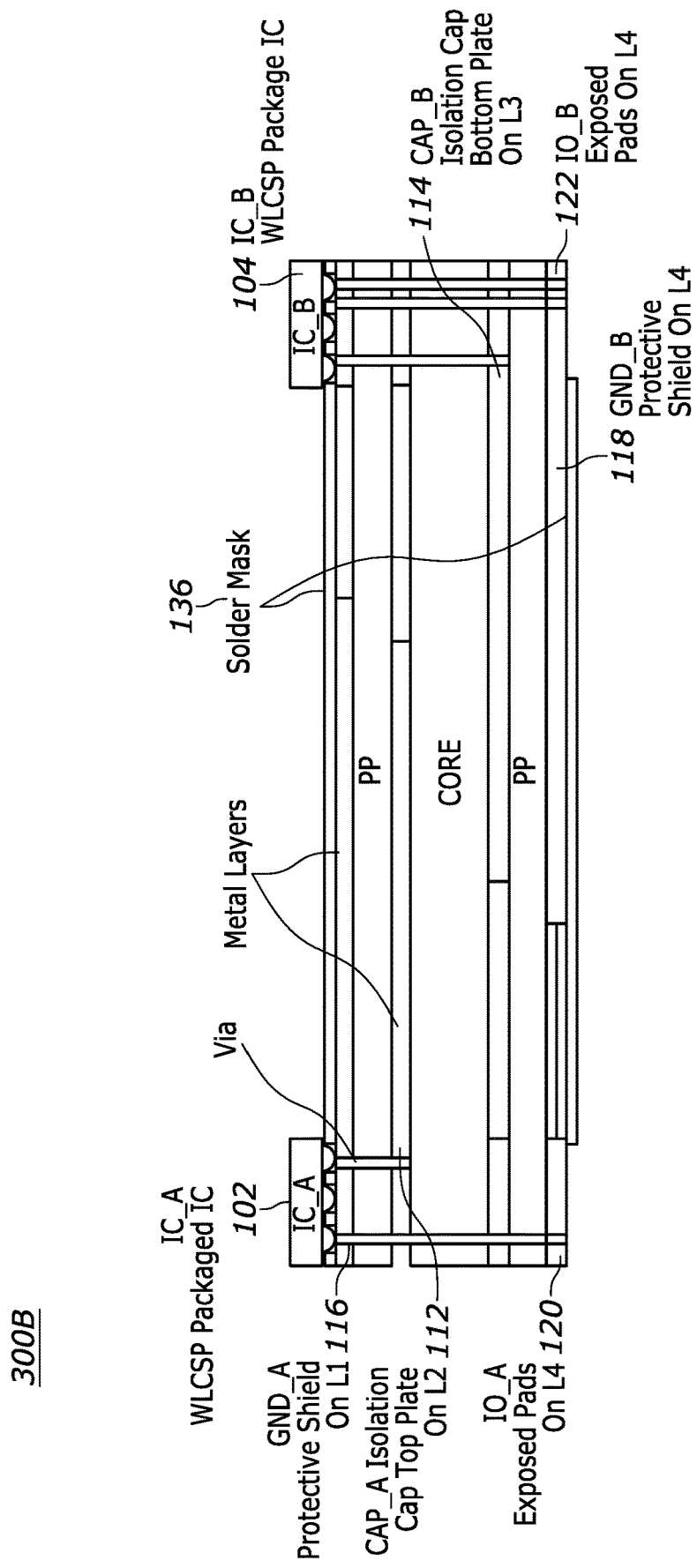
FIG. 3B depicts a cross-sectional view of components in the physical structure of the isolated communication system implemented on a 4-layer printed circuit board.
Figure 3C:
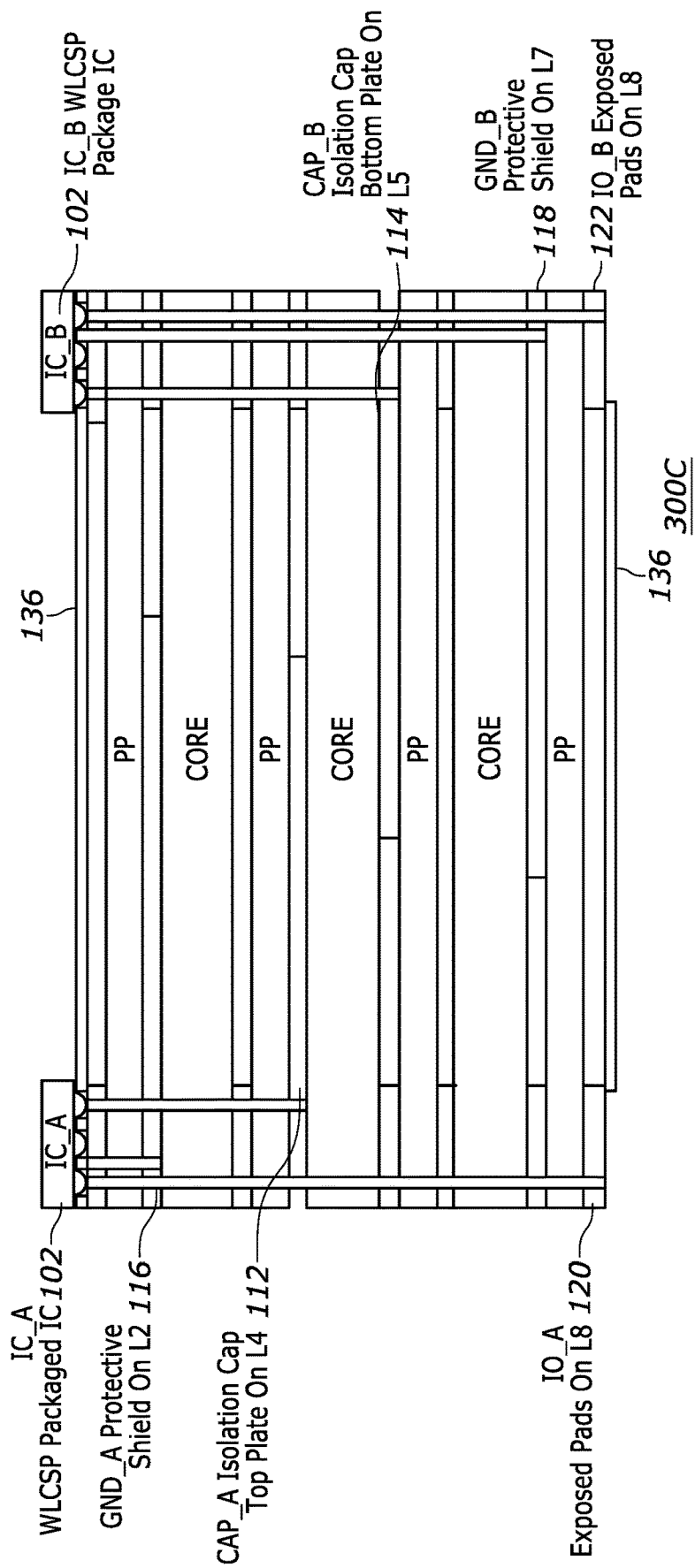
FIG. 3C depicts a cross-sectional view of components in the physical structure of the isolated communication system implemented on a an 8-layer printed circuit board.

FIGS. 3A-3C depict components in the physical structure of the isolated communication system. FIG. 3A depicts a top view 300A of components in the physical structure of the isolated communication system. The system of FIG. 3A includes IC_A WLCSP packaged IC 102, CAP_A isolation capacitor top plate 112, GND_A protective shield 116, IO_A exposed pads 120, IC_B WLCSP packaged IC 104, CAP_B isolation capacitor top plate 114, GND_B protective shield 118, and IO_B exposed pads 122.

FIG. 3B depicts a cross-sectional view 300B of components in the physical structure of the isolated communication system implemented on a 4-layer printed circuit board and FIG. 3C depicts a cross-sectional view 300C of components in the physical structure of the isolated communication system implemented on a an 8-layer printed circuit board. The components of FIG. 3B include IC_A WLCSP packaged IC 102, GND_A protective shield 116 on layer 1 (L1), CAP_A isolation capacitor top plate 112 on layer 2 (L2), IO_A exposed pads 120 on layer 4 (L4), IC_B WLCSP packaged IC 104, CAP_B isolation capacitor bottom plate 114 on layer 3 (L3), GND_B protective shield 118 on L4, IO_B exposed pads 122 on L4, vias, and solder masks. The components of FIG. 3C include IC_A WLCSP packaged IC 102, GND_A protective shield 116 on L2, CAP_A isolation capacitor top plate 112 on L4, IO_A exposed pads 120 on layer 8 (L8), B WLCSP packaged IC 104, CAP_B isolation capacitor bottom plate 114 on layer 5 (L5), GND_B protective shield 118 on layer 7 (L7), IO_B exposed pads 122 on L8, vias, and solder masks.

FIGS. 4A-9C provide layer-by-layer views of the galvanic isolation device in a 4-layer configuration and in an 8-layer configuration. Each of the layer-specific sets of figures, FIGS. 4A-4C, 5A-5C, 6A-6C, 7A-7C, 8A-8C, and 9A-9C, is described below.

Figure 4A:
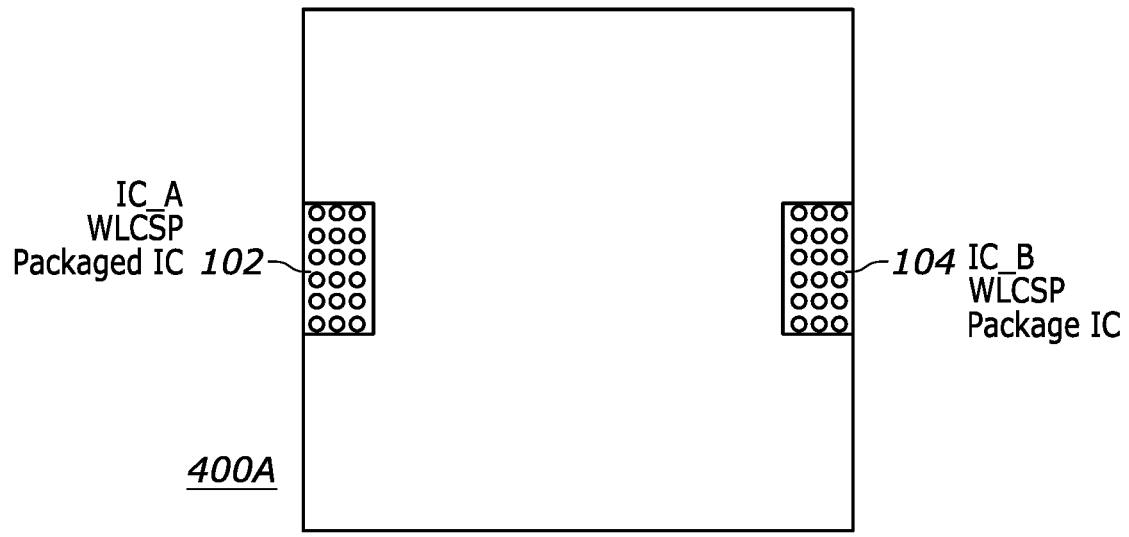
FIG. 4A depicts a top view of the IC_A and IC_B components in the physical structure of the isolated communication system.
Figure 4B:
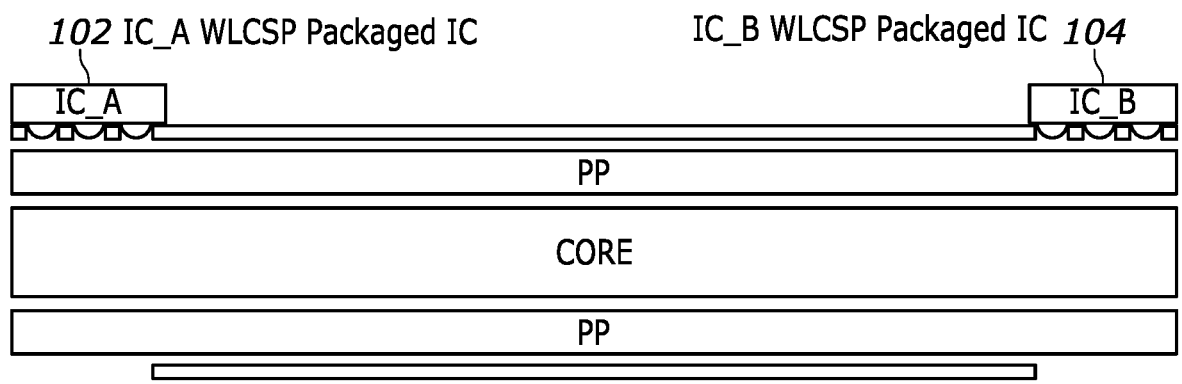
FIG. 4B depicts a cross-sectional view of the IC_A and IC_B components in the physical structure of the isolated communication system implemented on a 4-layer printed circuit board.
Figure 4C:
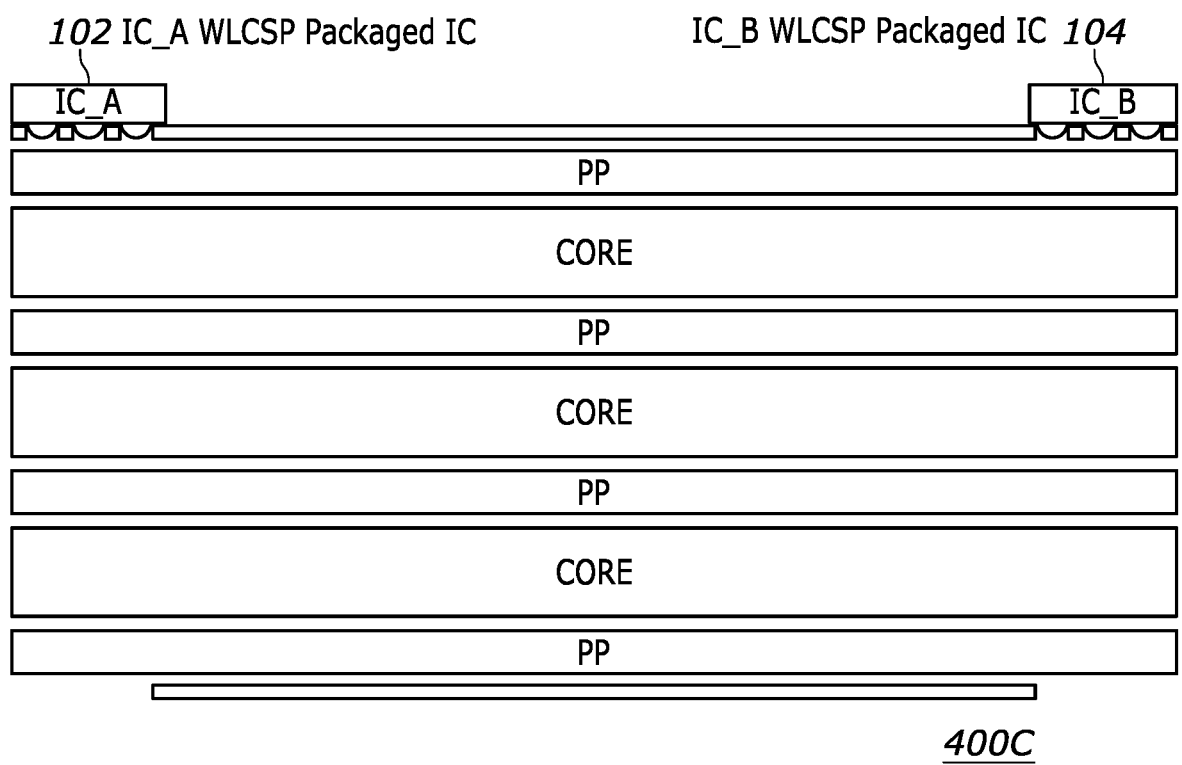
FIG. 4C depicts a cross-sectional view 400C of the IC_A and IC_B components in the physical structure of the isolated communication system implemented on an 8-layer printed circuit board.

FIGS. 4A-4C highlight IC_A and IC_B layer components in the physical structure of the isolated communication system. FIG. 4A depicts a top view 400A of the IC_A and IC_B components in the physical structure of the isolated communication system. In an embodiment, the IC device interfaces on the device include connection elements (e.g., conductive pads) that correspond to the locations of the balls on the WLCSP package IC. FIG. 4B depicts a cross-sectional view 400B of the IC_A and IC_B components in the physical structure of the isolated communication system implemented on a 4-layer printed circuit board and FIG. 4C depicts a cross-sectional view 400C of the IC_A and IC_B components in the physical structure of the isolated communication system implemented on an 8-layer printed circuit board.

Figure 5A:
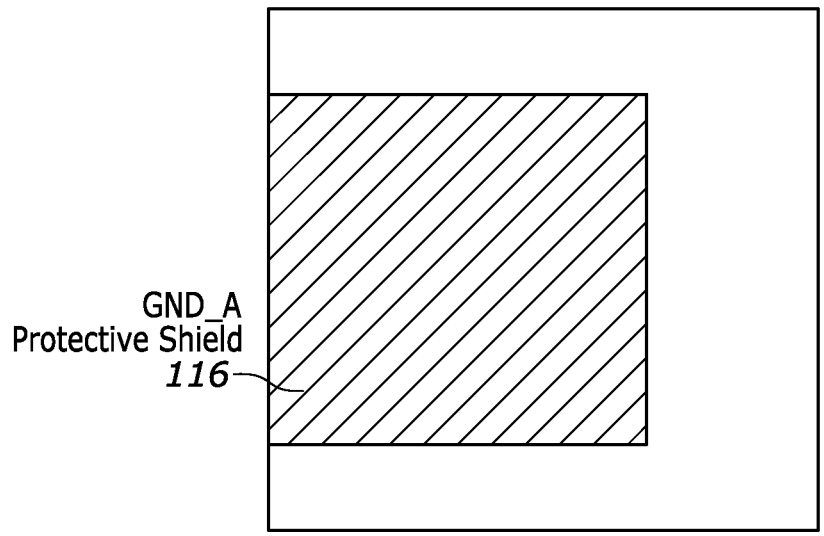
FIG. 5A depicts a top view of the GND_A component in the physical structure of the isolated communication system that includes the GND_A plate.
Figure 5B:
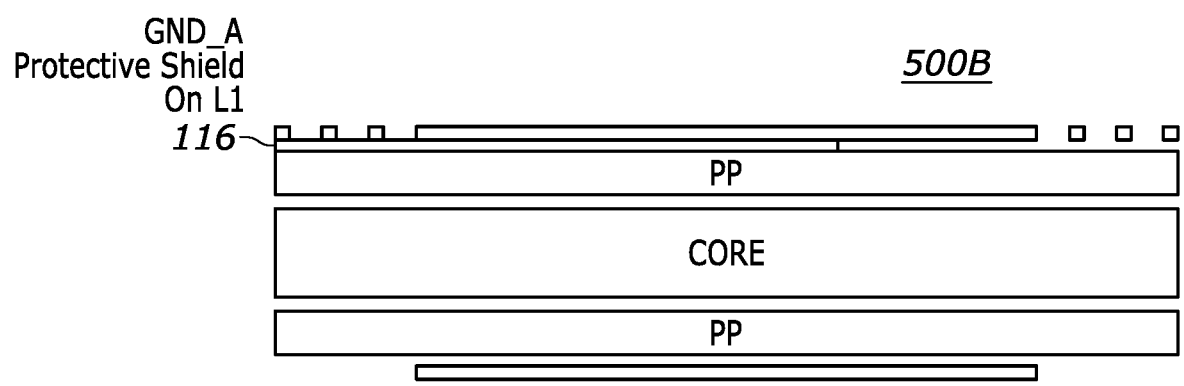
FIG. 5B depicts a cross-sectional view of the GND_A component in the physical structure of the isolated communication system implemented on a 4-layer printed circuit board.
Figure 5C:
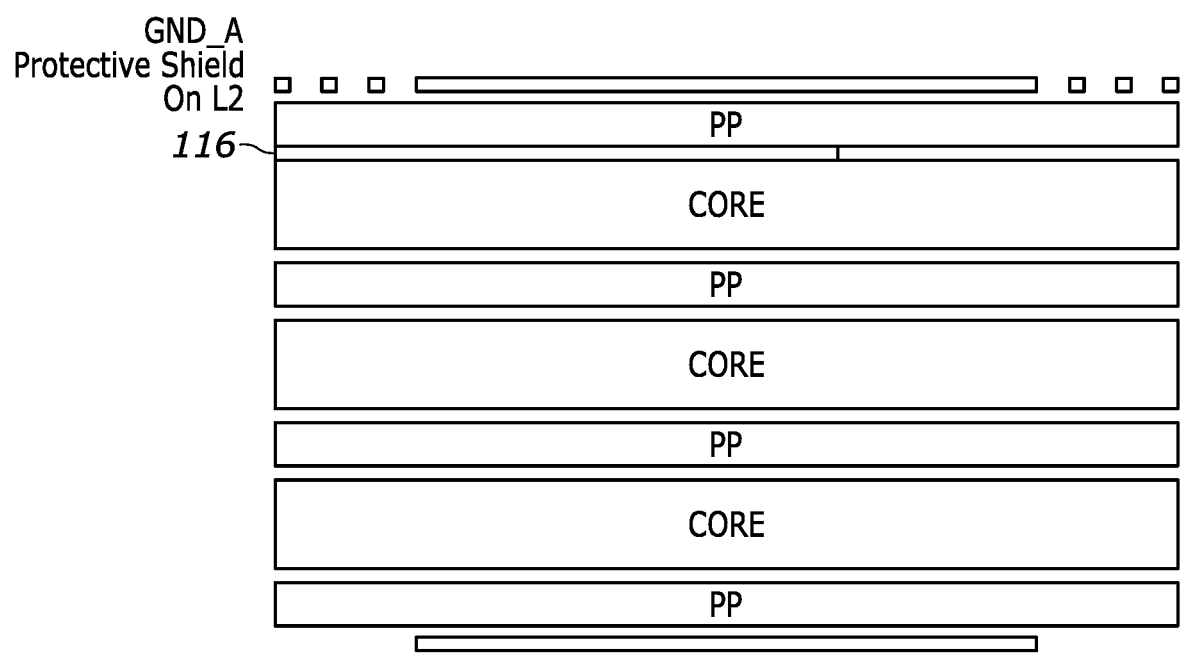
FIG. 5C depicts a cross-sectional view of the GND_A component in the physical structure of the isolated communication system implemented on an 8-layer printed circuit board.

FIGS. 5A-5C highlight the GND_A component layer in the physical structure of the isolated communication system. FIG. 5A depicts a top view 500A of the GND_A component in the physical structure of the isolated communication system that includes the GND_A plate 116. FIG. 5B depicts a cross-sectional view 500B of the GND_A component in the physical structure of the isolated communication system implemented on a 4-layer printed circuit board and FIG. 5C depicts a cross-sectional view 500C of the GND_A component in the physical structure of the isolated communication system implemented on an 8-layer printed circuit board. As shown in FIG. 5B, the GND_A component layer is on top of the PP layer and in FIG. 5C, the GND_A component layer is between the upper core layer and the upper PP layer.

Figure 6A:
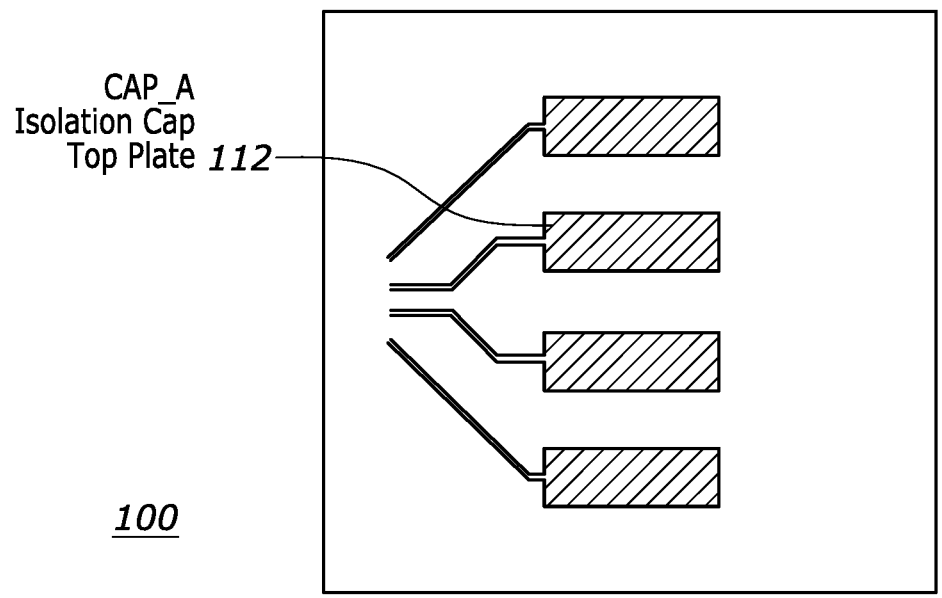
FIG. 6A depicts a top view of the CAP_A component in the physical structure of the isolated communication system that includes CAP_A isolation capacitor top plate.
Figure 6B:
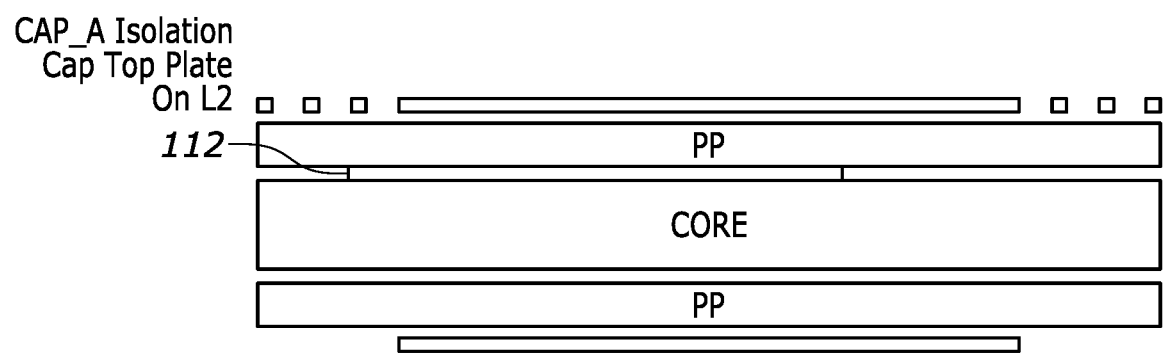
FIG. 6B depicts a cross-sectional view of the CAP_A component in the physical structure of the isolated communication system implemented on a 4-layer printed circuit board.
Figure 6C:
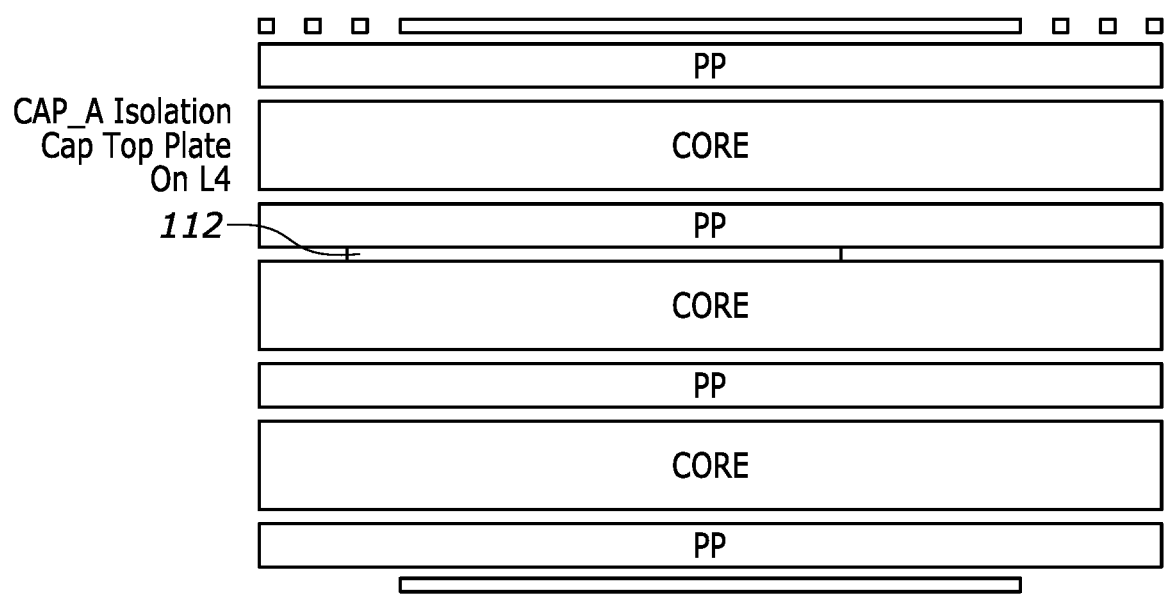
FIG. 6C depicts a cross-sectional view of the CAP_A component in the physical structure of the isolated communication system implemented on an 8-layer printed circuit board.

FIGS. 6A-6C highlight the CAP_A component in the physical structure of the isolated communication system. FIG. 6A depicts a top view 600A of the CAP_A component in the physical structure of the isolated communication system that includes CAP_A isolation capacitor top plate 112. FIG. 6B depicts a cross-sectional view 600B of the CAP_A component in the physical structure of the isolated communication system implemented on a 4-layer printed circuit board and FIG. 6C depicts a cross-sectional view 600C of the CAP_A component in the physical structure of the isolated communication system implemented on an 8-layer printed circuit board.

Figure 7A:
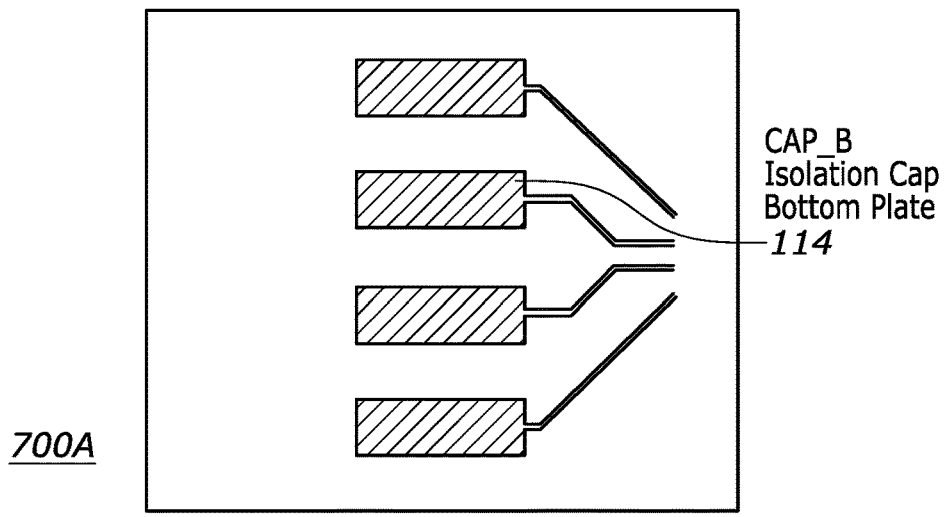
FIG. 7A depicts a top view of the CAP_B component in the physical structure of the isolated communication system that includes CAP_B isolation capacitor bottom plate.
Figure 7B:
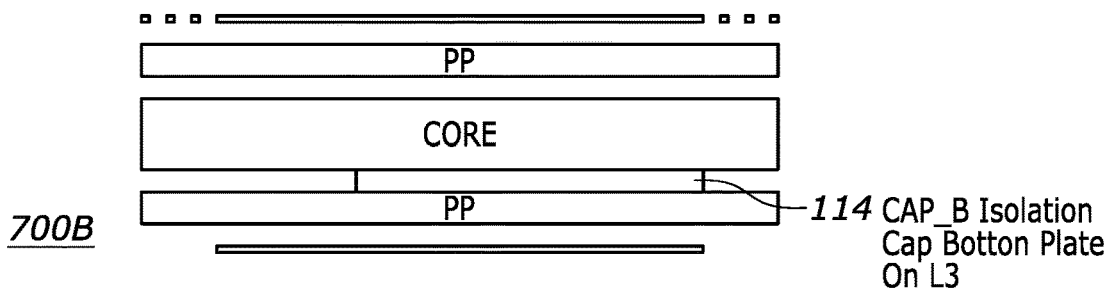
FIG. 7B depicts a cross-sectional view of the CAP_B component in the physical structure of the isolated communication system implemented on a 4-layer printed circuit board.
Figure 7C:
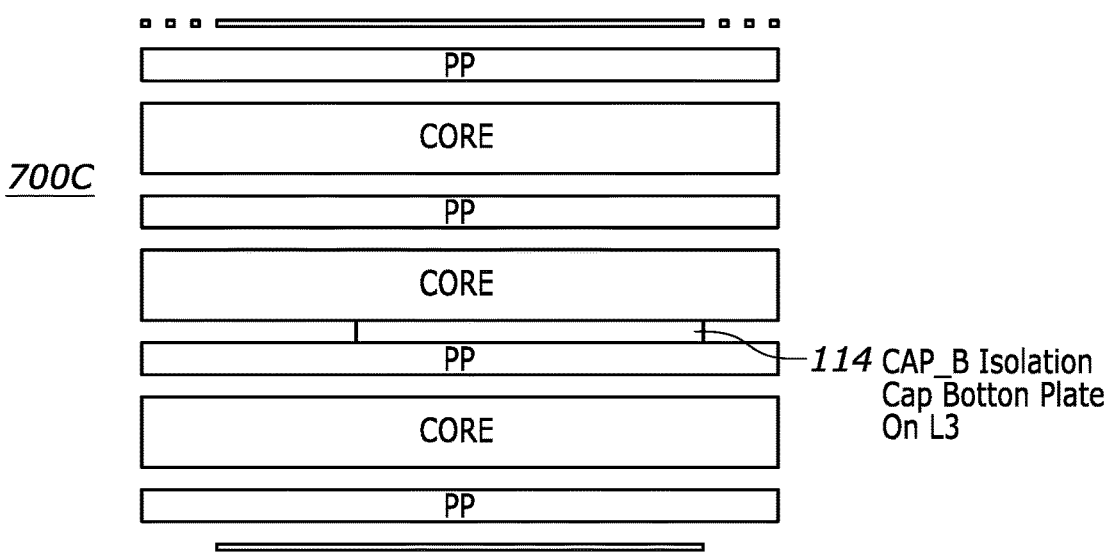
FIG. 7C depicts a cross-sectional view of the CAP_B component in the physical structure of the isolated communication system implemented on an 8-layer printed circuit board.

FIGS. 7A-7C depict the CAP_B component in the physical structure of the isolated communication system. FIG. 7A depicts a top view 700A of the CAP_B component in the physical structure of the isolated communication system that includes CAP_B isolation capacitor bottom plate 114. FIG. 7B depicts a cross-sectional view 700B of the CAP_B component in the physical structure of the isolated communication system implemented on a 4-layer printed circuit board and FIG. 7C depicts a cross-sectional view 700C of the CAP_B component in the physical structure of the isolated communication system implemented on an 8-layer printed circuit board.

Figure 8A:
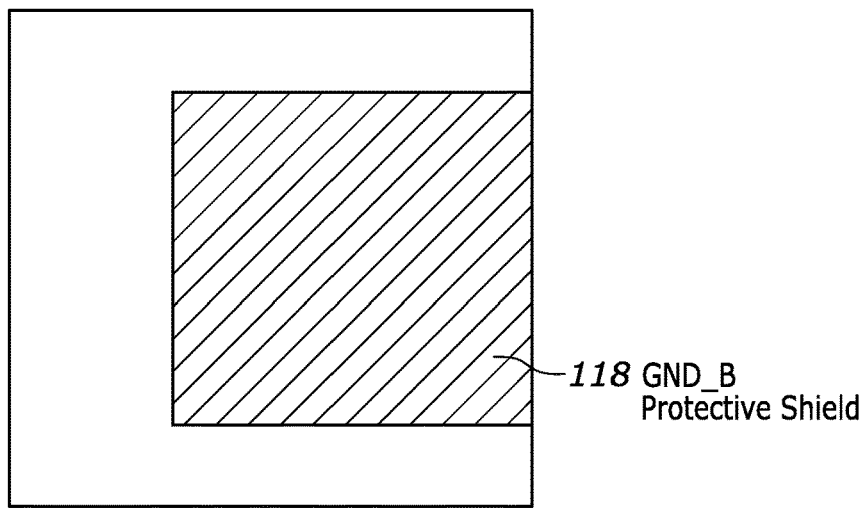
FIG. 8A depicts a top view of the GND_B component in the physical structure of the isolated communication system that includes GND_B protective shield.
Figure 8B:
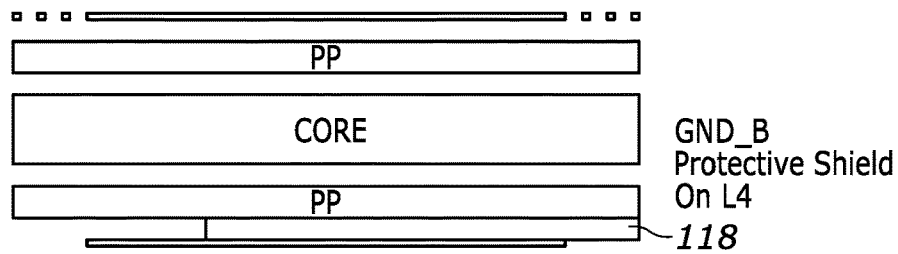
FIG. 8B depicts a cross-sectional view of the GND_B component in the physical structure of the isolated communication system implemented on a 4-layer printed circuit board.
Figure 8C:
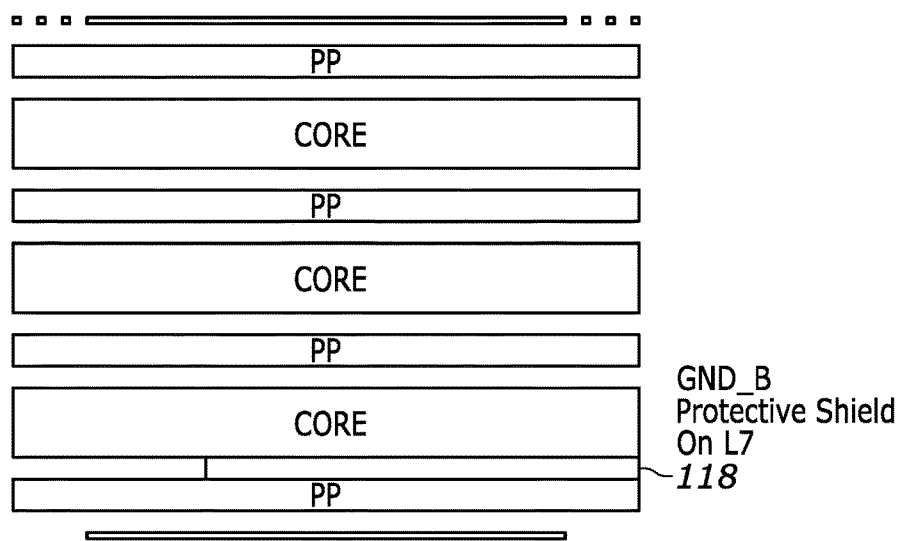
FIG. 8C depicts a cross-sectional view of the GND_B component in the physical structure of the isolated communication system implemented on an 8-layer printed circuit board.

FIGS. 8A-8C highlight the GND_B component in the physical structure of the isolated communication system. FIG. 8A depicts a top view 800A of the GND_B component in the physical structure of the isolated communication system that includes GND_B protective shield 118. FIG. 8B depicts a cross-sectional view 800B of the GND_B component in the physical structure of the isolated communication system implemented on a 4-layer printed circuit board and FIG. 8C depicts a cross-sectional view 800C of the GND_B component in the physical structure of the isolated communication system implemented on an 8-layer printed circuit board.

Figure 9A:
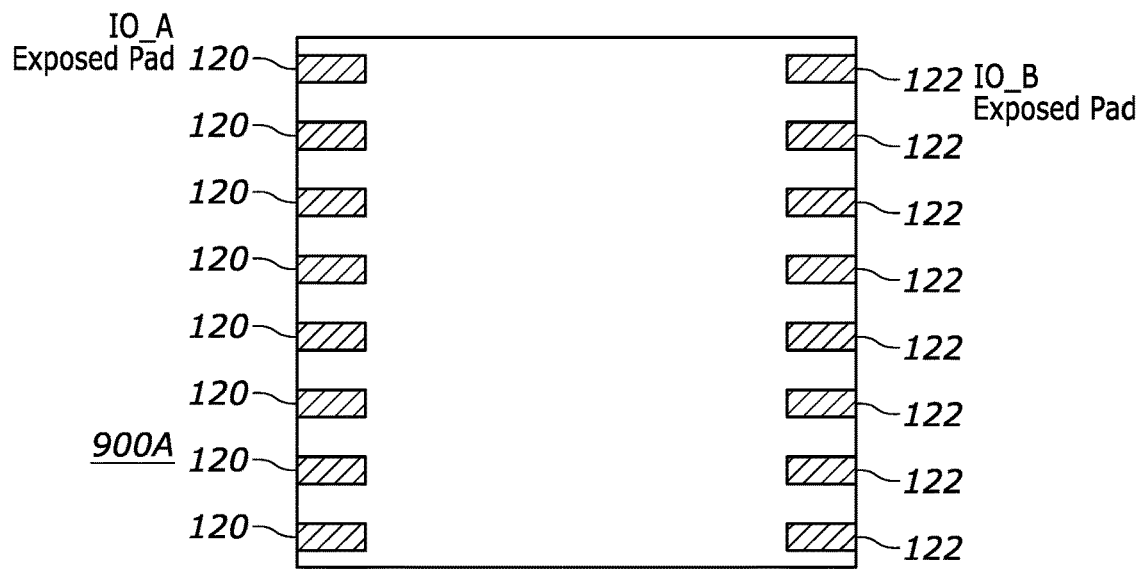
FIG. 9A depicts a top view of the IO_A and IO _B components in the physical structure of the isolated communication system.
Figure 9B:
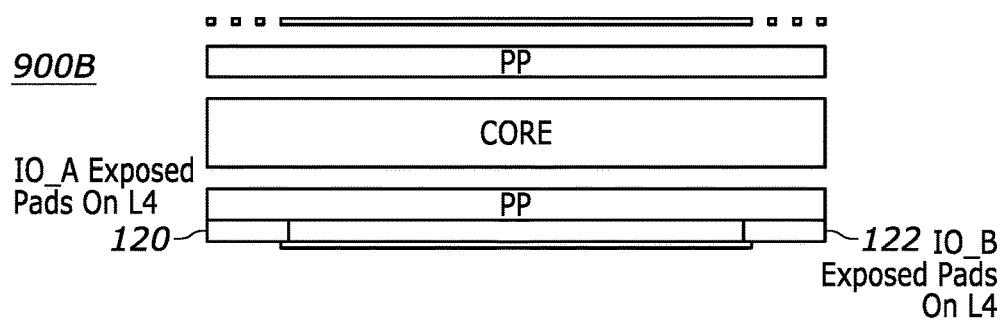
FIG. 9B depicts a cross-sectional view of the IO_A and IO_B components in the physical structure of the isolated communication system implemented on a 4-layer printed circuit board.
Figure 9C:
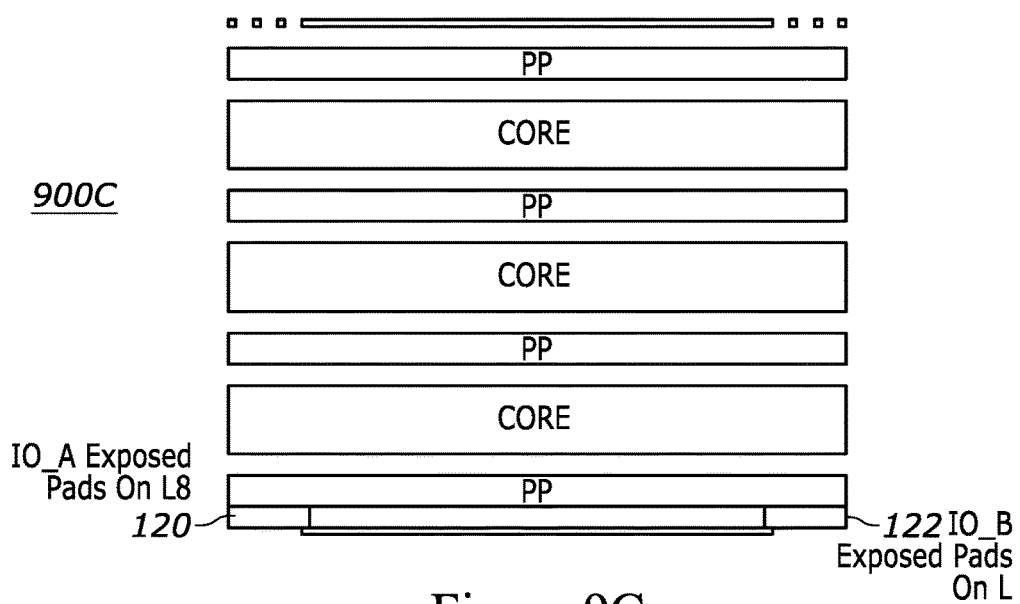
FIG. 9C depicts a cross-sectional view of the IO_A and IO_B components in the physical structure of the isolated communication system implemented on an 8-layer printed circuit board.

FIGS. 9A-9C highlight the IO_A and IO_B components in the physical structure of the isolated communication system that includes IO_A and IO_B exposed pads 120 and 122. FIG. 9A depicts a top view 900A of the IO_A and IO_B components in the physical structure of the isolated communication system. FIG. 9B depicts a cross-sectional view 900B of the IO_A and IO_B components in the physical structure of the isolated communication system implemented on a 4-layer printed circuit board and FIG. 9C depicts a cross-sectional view 900C of the IO_A and IO_B components in the physical structure of the isolated communication system implemented on an 8-layer printed circuit board.

Figure 10:
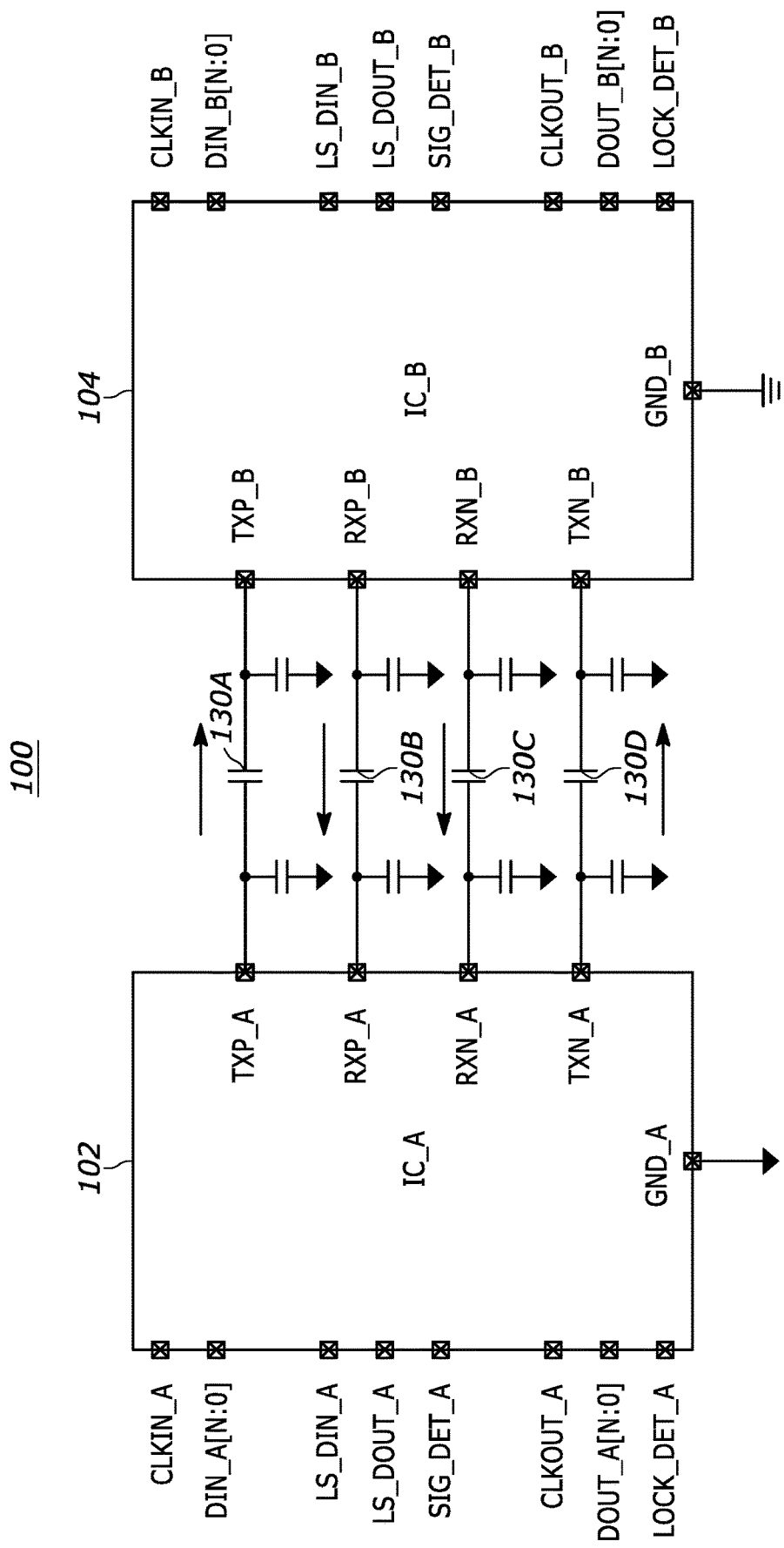
FIG. 10 depicts a block diagram of an example of an isolated communication system.

FIG. 10 depicts a block diagram of an example of an isolated communication system 100. The system includes two integrated circuits, IC_A 102 and IC_B 104. IC_A and IC_B are coupled together through four isolation capacitors 130A, 130B, 130C, and 130D (e.g., as formed by overlapping top and bottom capacitor plates, CAP_A 112 and CAP_B 114) connected in series for bidirectional communication. IC_A and IC_B each include a transceiver for transmitting and receiving high-frequency signals through isolation capacitors. In an embodiment, the two series capacitors, 130A and 130D, closer to the outer edges of printed circuit board couple a first differential signal from the transmitter TX_A of IC_A 102 to the receiver RX_B of IC_B 104 (TXP_A to RXP_B and TXN_A to RXN_B, transmit positive and transmit negative from IC_A to IC_B) and the two series capacitors, 130B and 130C, closer to the center of printed circuit board couple a second differential signal from the transmitter TX_B of IC_B 104 to the receiver RX_A of IC_A 102 (TXP_B to RXP_A and TXN_B to RXN_A, transmit positive and transmit negative from IC_B to IC_A). This arrangement achieves symmetric matching between any two capacitors coupling a differential signal required for rejecting of common-mode noise.

Other topologies for communication are also possible. For example, a unidirectional, half-duplex or time-division multiplexed isolated communication can be accomplished with only one differential capacitor pair with two series capacitors. The number of differential capacitor pairs can also be increased for higher throughput with multi-bit serial communication. One additional differential capacitor pair can be added in the topology presented in FIG. 10 to transmit a clock signal for synchronous communication between IC_A and IC_B that does not require clock recovery in the receiver.

Figure 11A:
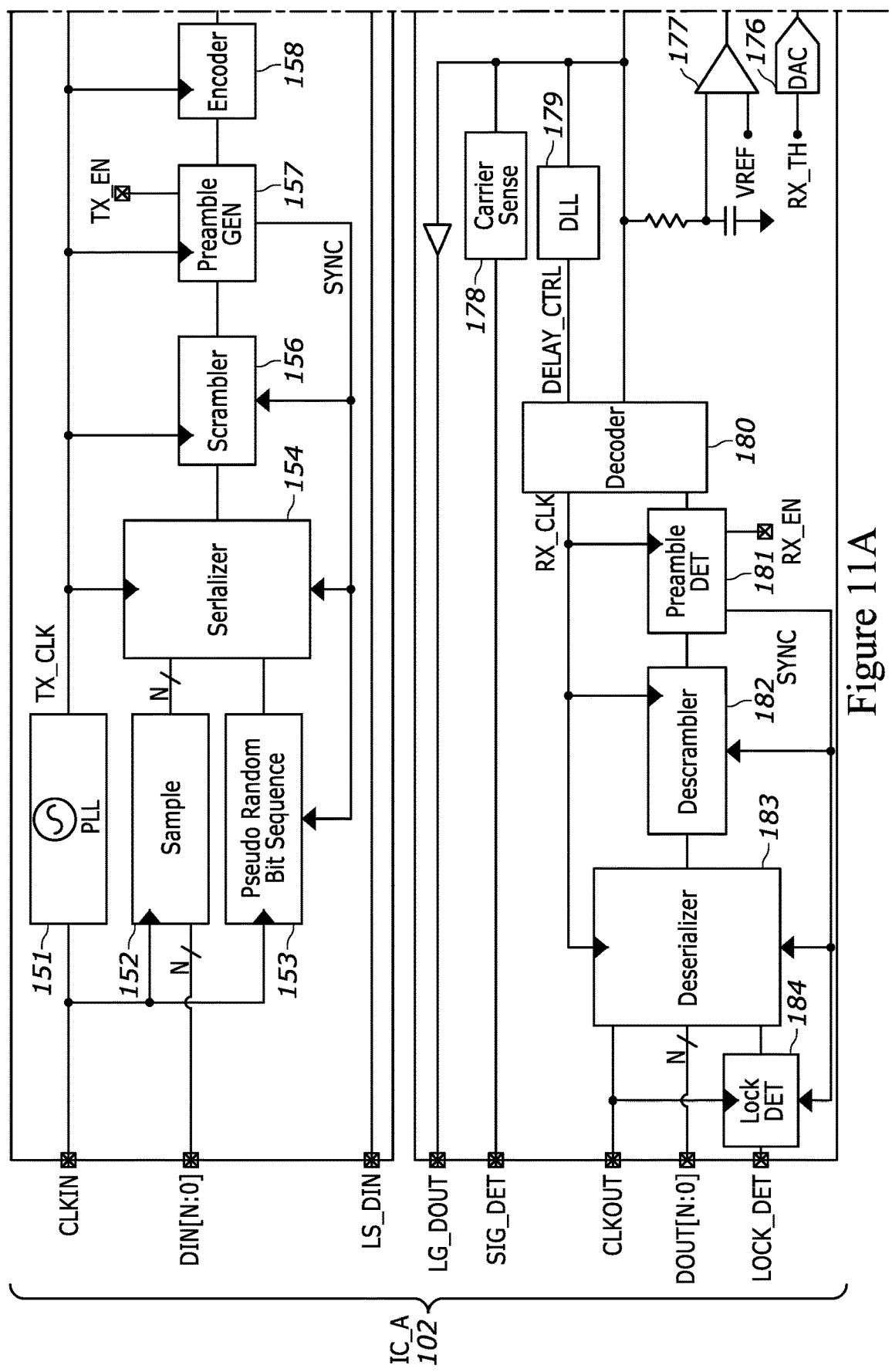
FIGS. 11A and 11B depict an example architecture of the transceiver in IC_A and IC_B.
Figure 11B:
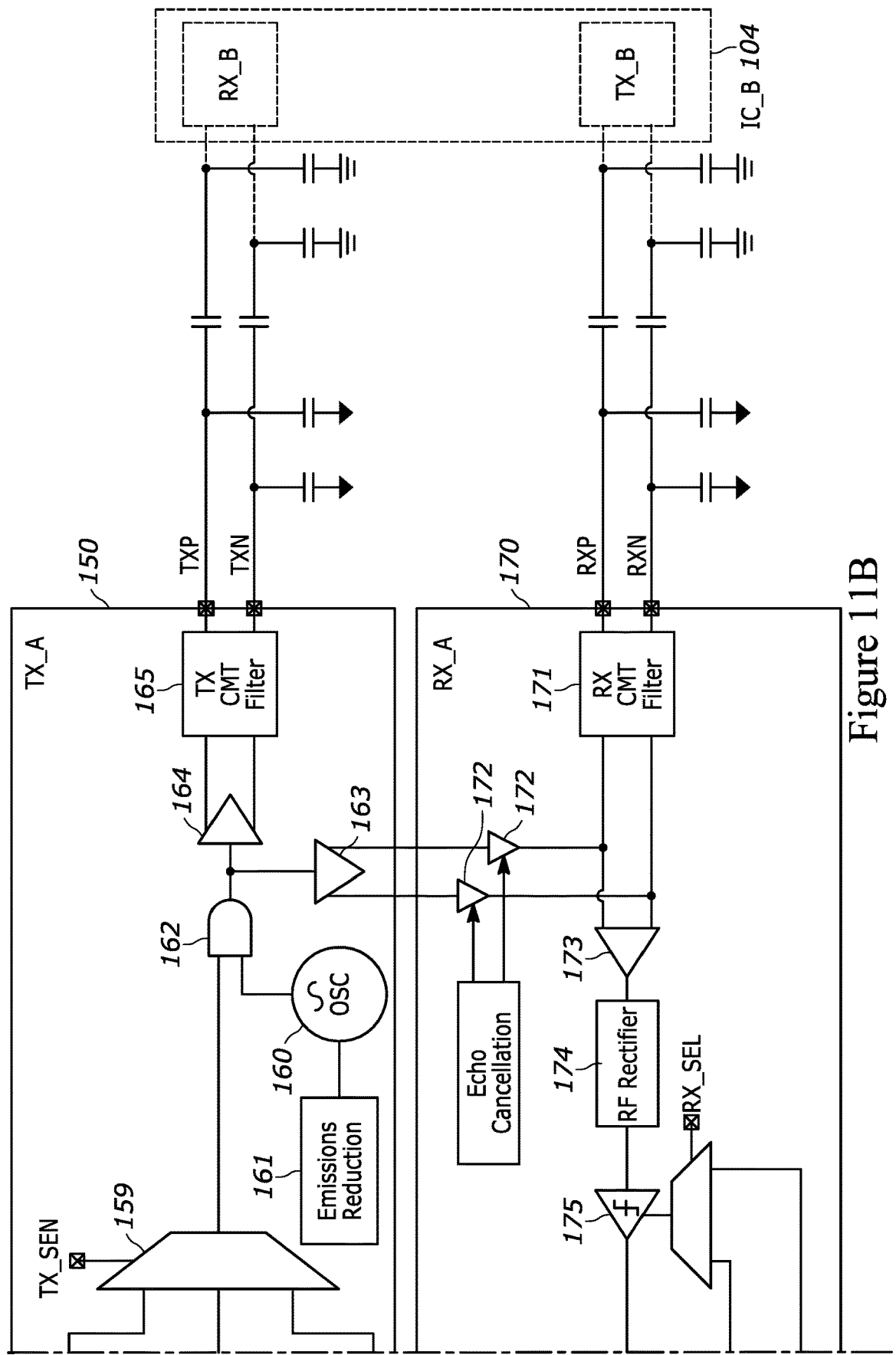

FIGS. 11A and 11B depict an example architecture of the transceiver in IC_A 102 and IC_B 104. In particular, FIGS. 11A and 11B show an expanded view of the transmitter (TX_A) of IC_A and of the receiver (RX_A) of IC_A. In order to support multi-channel data communication across a single isolated channel, the transmitter in each IC serializes the parallel input data into a serial bitstream. The serialized bitstream is scrambled to ensure a fixed rate irrespective of the input data that was serialized. The scrambled bitstream is encoded with the Manchester Encoding scheme to ensure a transition in each bit period that facilitates recovering the appropriate clock signal required in the receiver of the other IC for decoding the data. The encoded bitstream modulates a Radio Frequency carrier signal in the transmitter with On-Off-Keying (OOK) modulation. The modulated signal is transmitted over the isolated capacitors through a power amplifier.

An attenuated version of the transmitted RF signal may be received at the other IC due to weak capacitive coupling and losses through the isolated channel. Hence the received signal may be amplified in the receiver of each IC. An Envelope Detector in the receiver demodulates the amplified RF signal to recover the Manchester Encoded signal. A decoder with a Delay Locked Loop (DLL) decodes the signal to recover the bitstream with its clock signal. The recovered clock is used to descramble and deserialize the bitstream into a parallel data output.

Fast common-mode transient (CMT) signals can couple through the differential capacitive coupling in the isolated channels. The common-mode noise can saturate the transceiver or induce noise that disrupts communication. High-voltage common-mode transients can permanently damage the transceiver from electrical over-stress. Therefore, in an embodiment, a filter network is added on the transmitter output and the receiver input for suppressing a common-mode transient signal that is coupled through the isolated channels. The CMT filter can be implemented with on-chip transformers that also protect the sensitive transceiver front-end from electro-static discharge events.

In an embodiment, a replica of the transmitted signal with a variable gain is subtracted from the received signal to suppress the transmitter echo resulting from undesired coupling from the transmitter to a receiver on the same IC. An active echo cancellation topology is depicted in FIGS. 11A and 11B. Alternatively, passive echo cancellation topology can be used by capacitively coupling inverted transmitter output to the receiver input for cancelling self-interference.

In the example of FIGS. 11A and 11B, the transmitter, TX_A, of IC_A 102 includes a phase locked loop (PLL) 151, an input sampler 152, a pseudo random bit sequence generator 153, a serializer 154, a scrambler 156, a synchronizer with preamble generator 157, an encoder 158, an output multiplexer 159, a radio frequency (RF) oscillator 160 with a modulator for emissions reduction, an OOK modulator 162, an output buffer 163 for echo-cancellation, an output power amplifier 164 and an output common-mode transient (CMT) filter 165. The receiver 170, RX_A, of IC_A includes an input common-mode transient (CMT) filter 171, variable-gain amplifiers for echo-cancellation 172, an input amplifier 173, a radio frequency (RF) full-wave rectifier 174, a comparator 175 with an adjustable threshold from a digital to analog converter (DAC) 176 or an amplitude tracking amplifier 177, a carrier detector 178, a delay locked loop (DLL) 179, a decoder 180, a synchronizer with preamble detector 181, a descrambler 182, a deserializer 183, and a lock detector 184.

Although FIGS. 11A and 11B are provided as an example, other configurations of the transceivers are possible that use modulation schemes other than OOK and Manchester encoding. Amplitude Shift Keying (ASK) modulation with a higher modulation index can be used for increased throughput. ASK modulation can be implemented by transmitting a multi-level signal and using an Analog to Digital Convertor implemented using Flash architecture for low latency detection in the receiver. A pilot symbol can be inserted at regular intervals to track the amplitude variation with temperature. Alternatively, the clock-recovery and synchronization mechanisms can be avoided by a synchronous communication topology when a clock reference is available. Digital error detection and error correction schemes can be added to improve the noise immunity of the communication system.

Figure 12A:
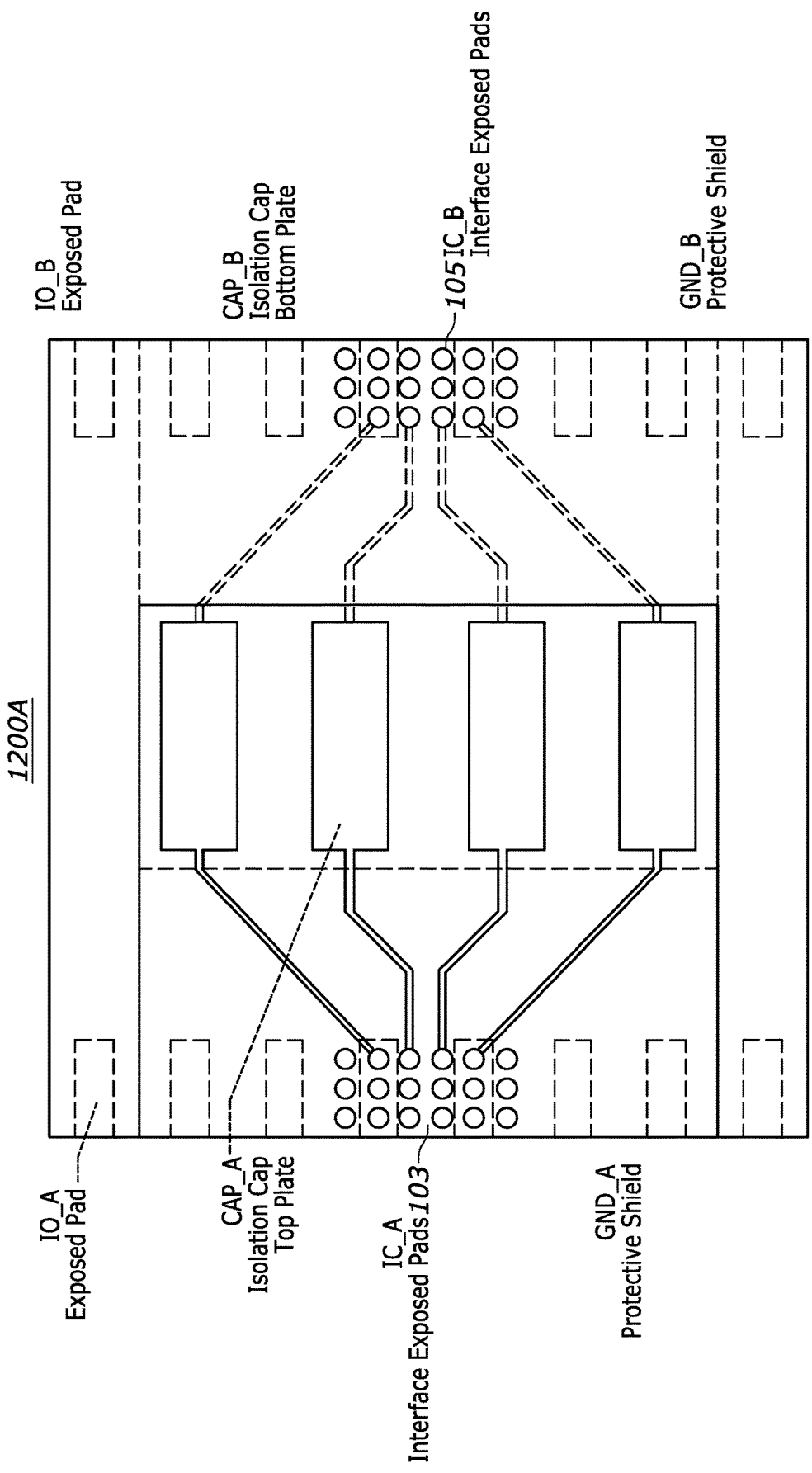
FIG. 12A depicts a top view of components in the physical structure of the galvanic isolation device.
Figure 12B:
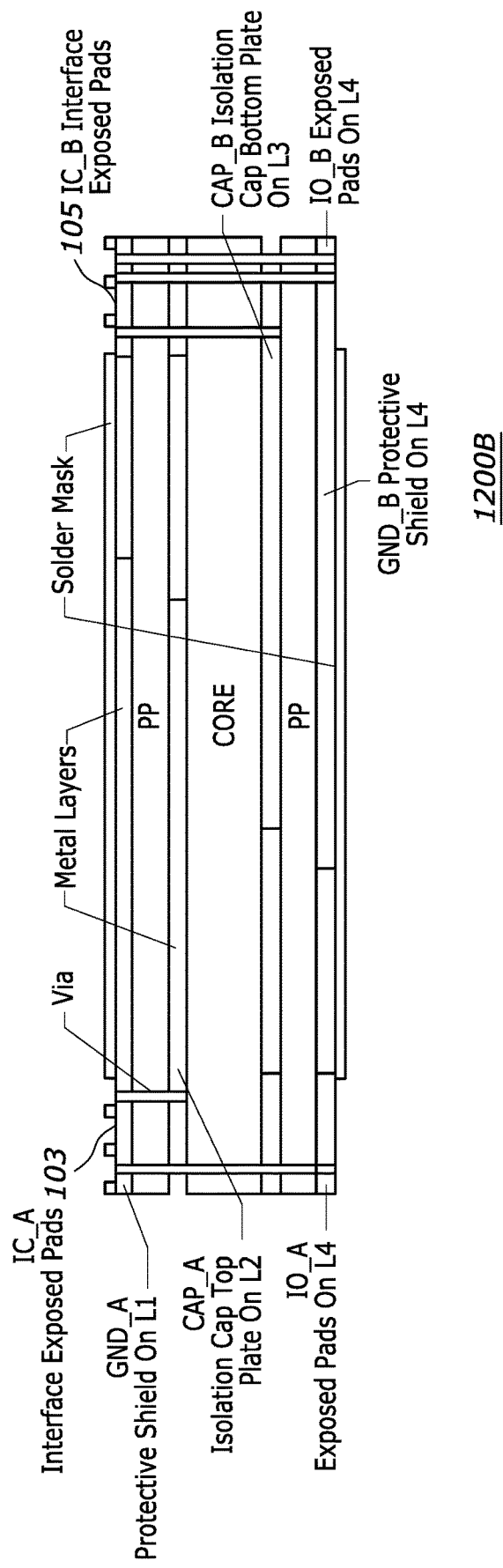
FIG. 12B depicts a cross-sectional view of components in the physical structure of the galvanic isolation device implemented on a 4-layer printed circuit board.
Figure 12C:
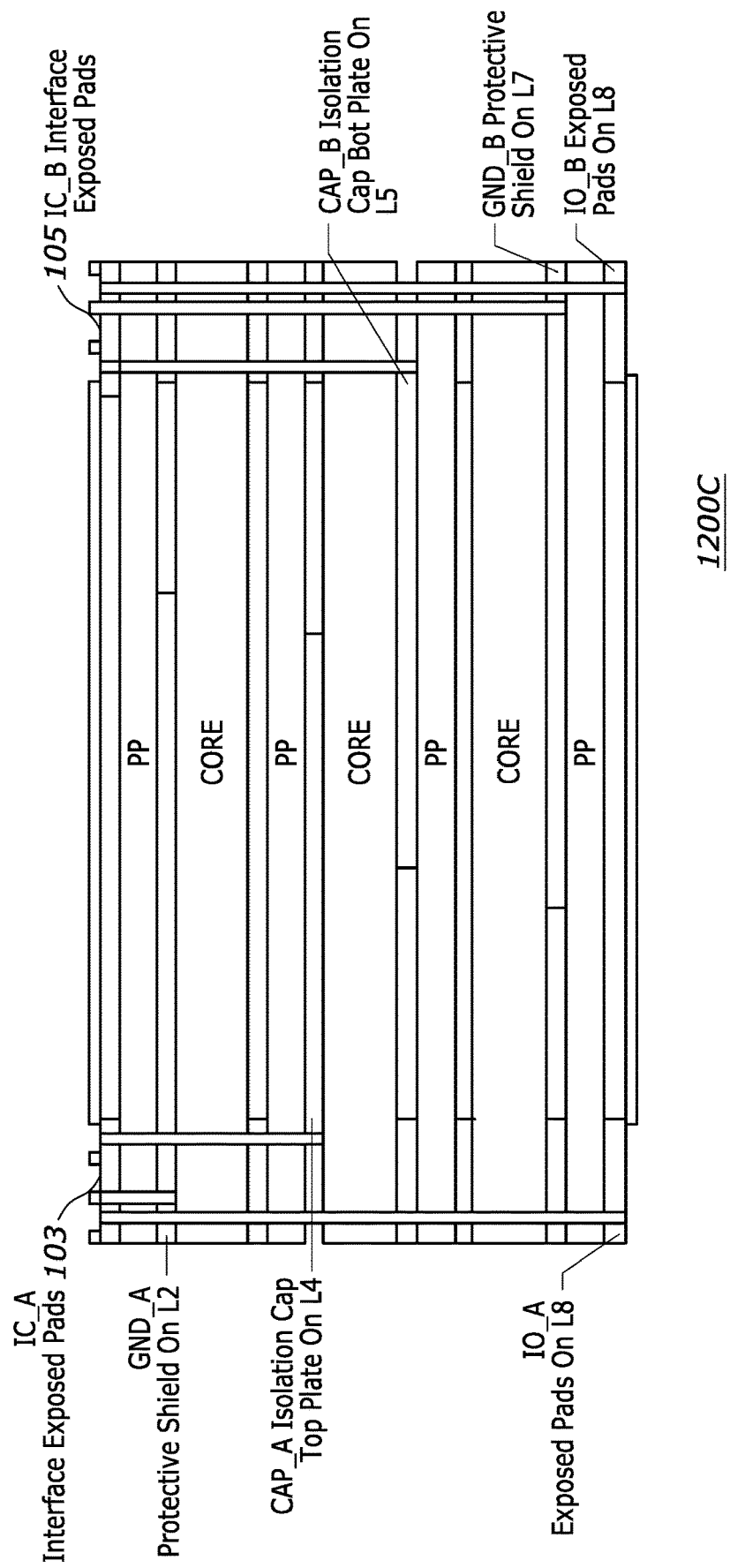
FIG. 12C depicts a cross-sectional view of components in the physical structure of the galvanic isolation device implemented on a an 8-layer printed circuit board.

FIGS. 12A-12C depict components in the physical structure of the galvanic isolation device without the IC devices, IC_A and IC_B connected to the device. FIG. 12A depicts a top view 1200A of components in the physical structure of the galvanic isolation device. The device of FIG. 12A includes IC_A interface 103, CAP_A isolation capacitor top plate 112, GND_A protective shield 116, IO_A exposed pads 120, IC_B interface 105, CAP_B isolation capacitor top plate 114, GND_B protective shield 118, and IO_B exposed pads 122.

FIG. 12B depicts a cross-sectional view 1200B of components in the physical structure of the galvanic isolation device implemented on a 4-layer printed circuit board and FIG. 12C depicts a cross-sectional view 1200C of components in the physical structure of the isolated communication system implemented on a an 8-layer printed circuit board. The components of FIG. 12B include IC_A interface 103, GND_A protective shield 116 on layer 1 (L1), CAP_A isolation capacitor top plate 112 on layer 2 (L2), IO_A exposed pads 120 on layer 4 (L4), IC_B interface 105, CAP_B isolation capacitor bottom plate 114 on layer 3 (L3), GND_B protective shield 118 on L4, IO_B exposed pads 122 on L4, vias, and solder masks. The components of FIG. 12C include IC_A interface 103, GND_A protective shield 116 on L2, CAP_A isolation capacitor top plate 112 on L4, IO_A exposed pads 120 on layer 8 (L8), IC_B interface 105, CAP_B isolation capacitor bottom plate 114 on layer 5 (L5), GND_B protective shield 118 on layer 7 (L7), IO_B exposed pads 122 on L8, vias, and solder masks. IC_A and IC_B integrated circuits would be are mounted on top of the device with their terminals directly connecting to the exposed pads on the top-most printed metal layer of the IC interfaces. Some of the interface exposed pads may serve non-IO functionality, such as power supply and grounding for IC_A and IC_B integrated circuits. Decoupling capacitors can be mounted on top of the printed circuit board, ideally close to power and ground interface exposed pads for bypassing noise in the power supply to IC_A and IC_B integrated circuits.

Figure 13A:
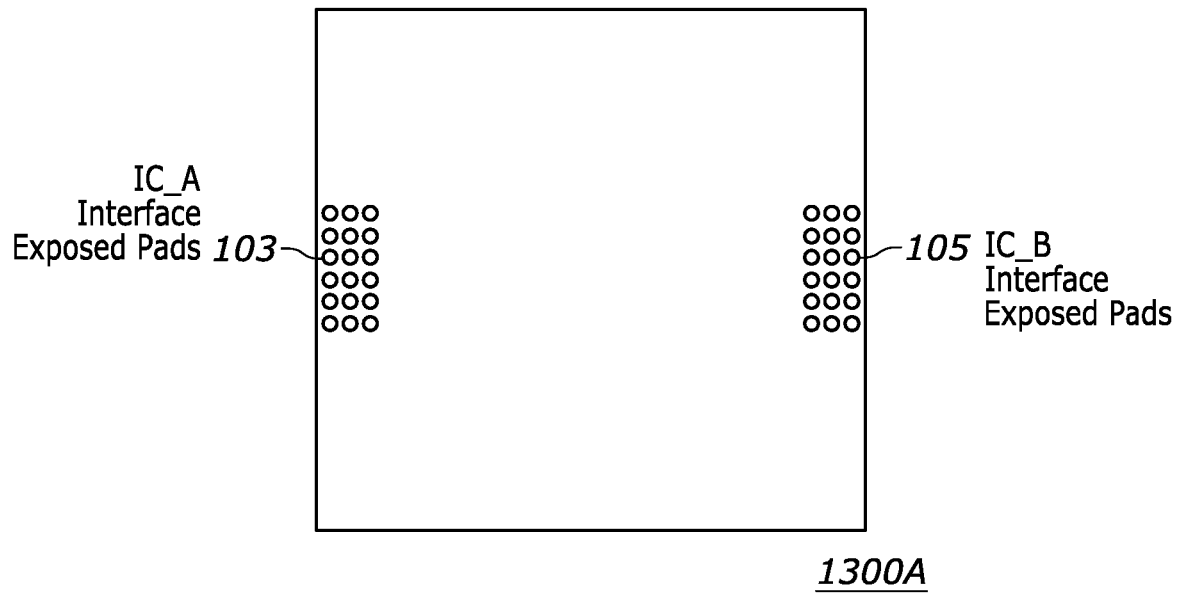
FIG. 13A depicts a top view of the IC_A and IC_B interfaces in the physical structure of the galvanic isolation device.
Figure 13B:
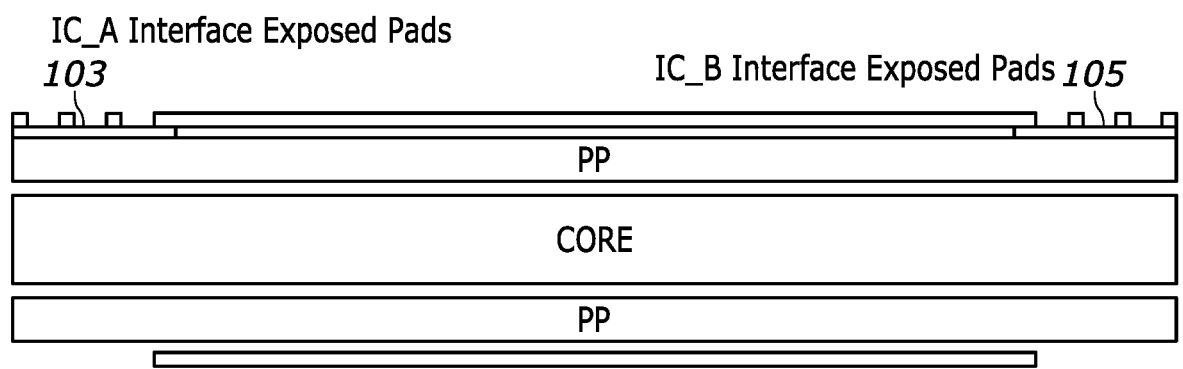
FIG. 13B depicts a cross-sectional view of the IC_A and IC_B interfaces in the physical structure of the galvanic isolation device implemented on a 4-layer printed circuit board.
Figure 13C:
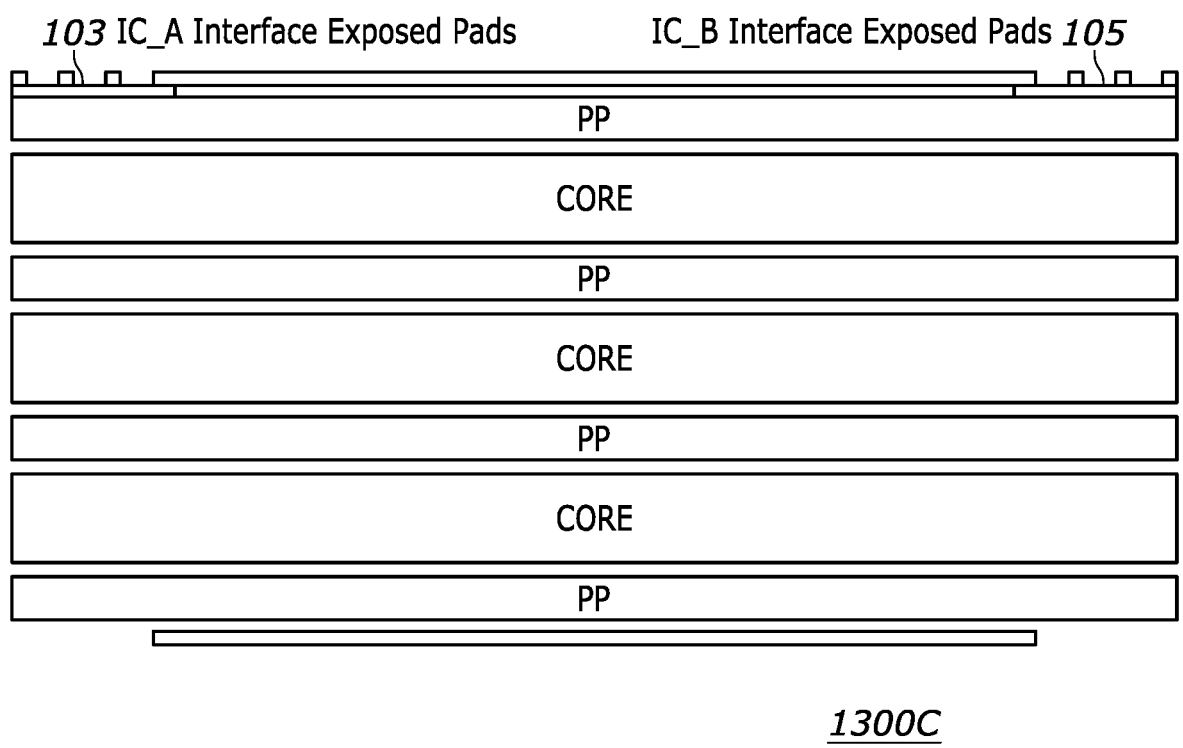
FIG. 13C depicts a cross-sectional view of the IC_A and IC_B interfaces in the physical structure of the galvanic isolation device implemented on an 8-layer printed circuit board.

FIGS. 13A-13C highlight IC_A interface and IC_B interface components in the physical structure of the galvanic isolation device that includes the IC_A interface 103 and the IC_B interface 105. FIG. 13A depicts a top view 1300A of the IC_A and IC_B interfaces in the physical structure of the galvanic isolation device. FIG. 13B depicts a cross-sectional view 1300B of the IC_A and IC_B interfaces in the physical structure of the galvanic isolation device implemented on a 4-layer printed circuit board and FIG. 13C depicts a cross-sectional view 1300C of the IC_A and IC_B interfaces in the physical structure of the galvanic isolation device implemented on an 8-layer printed circuit board.

Figure 14A:
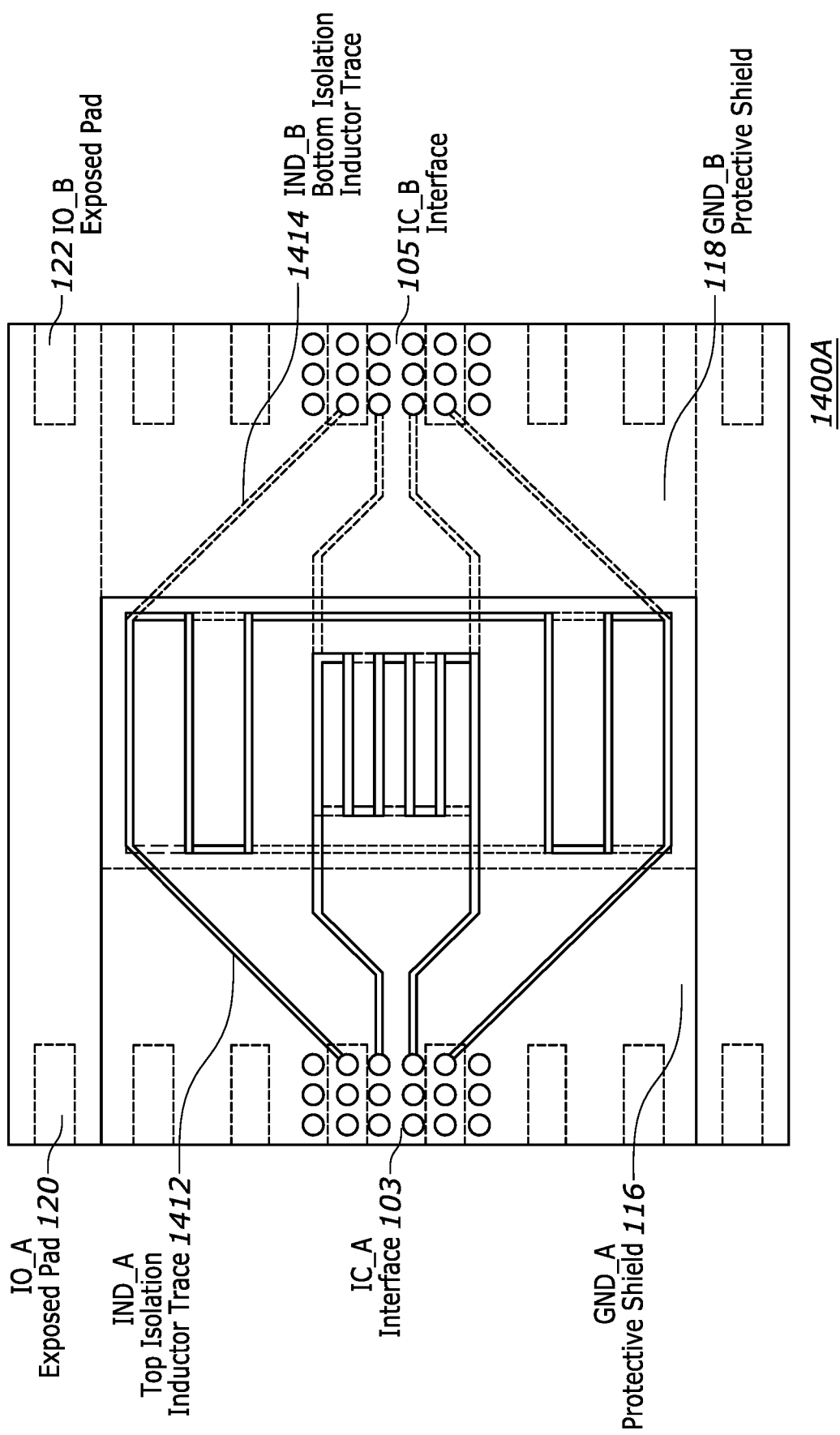
FIG. 14A depicts a top view of components in the physical structure of the galvanic isolation device without the IC devices, IC_A and IC_B, attached.
Figure 14B:
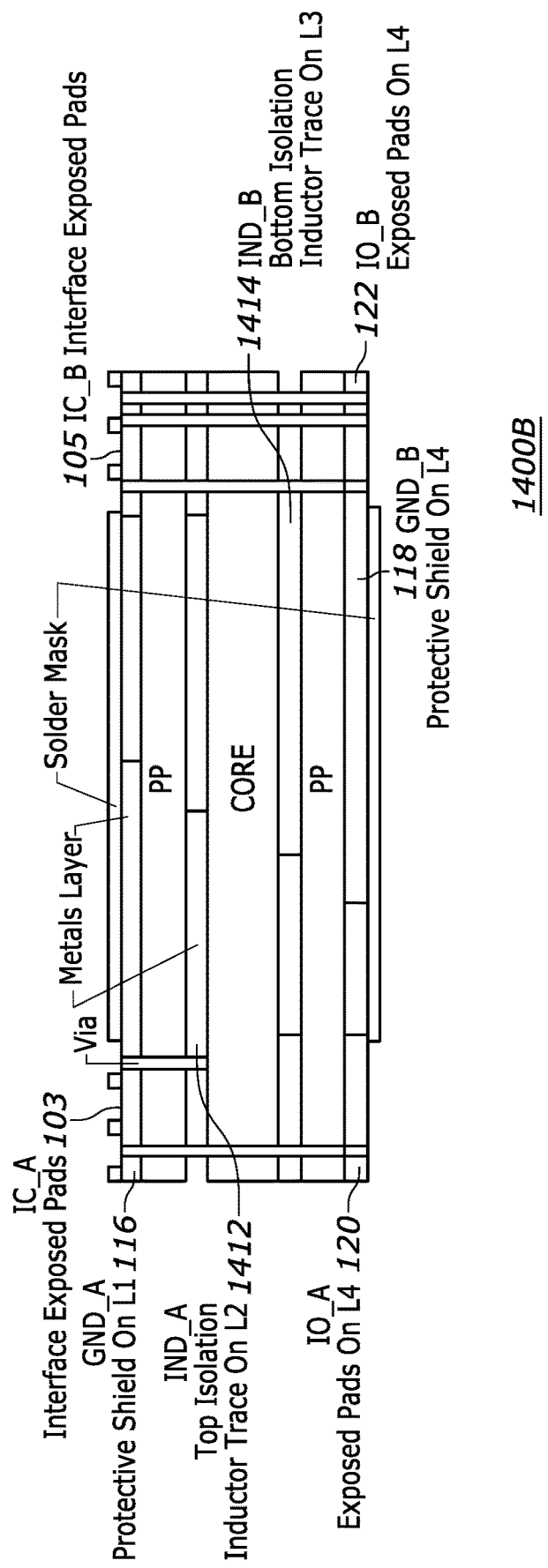
FIG. 14B depicts a cross-sectional view of components in the physical structure of the galvanic isolation device implemented on a 4-layer printed circuit board.
Figure 14C:
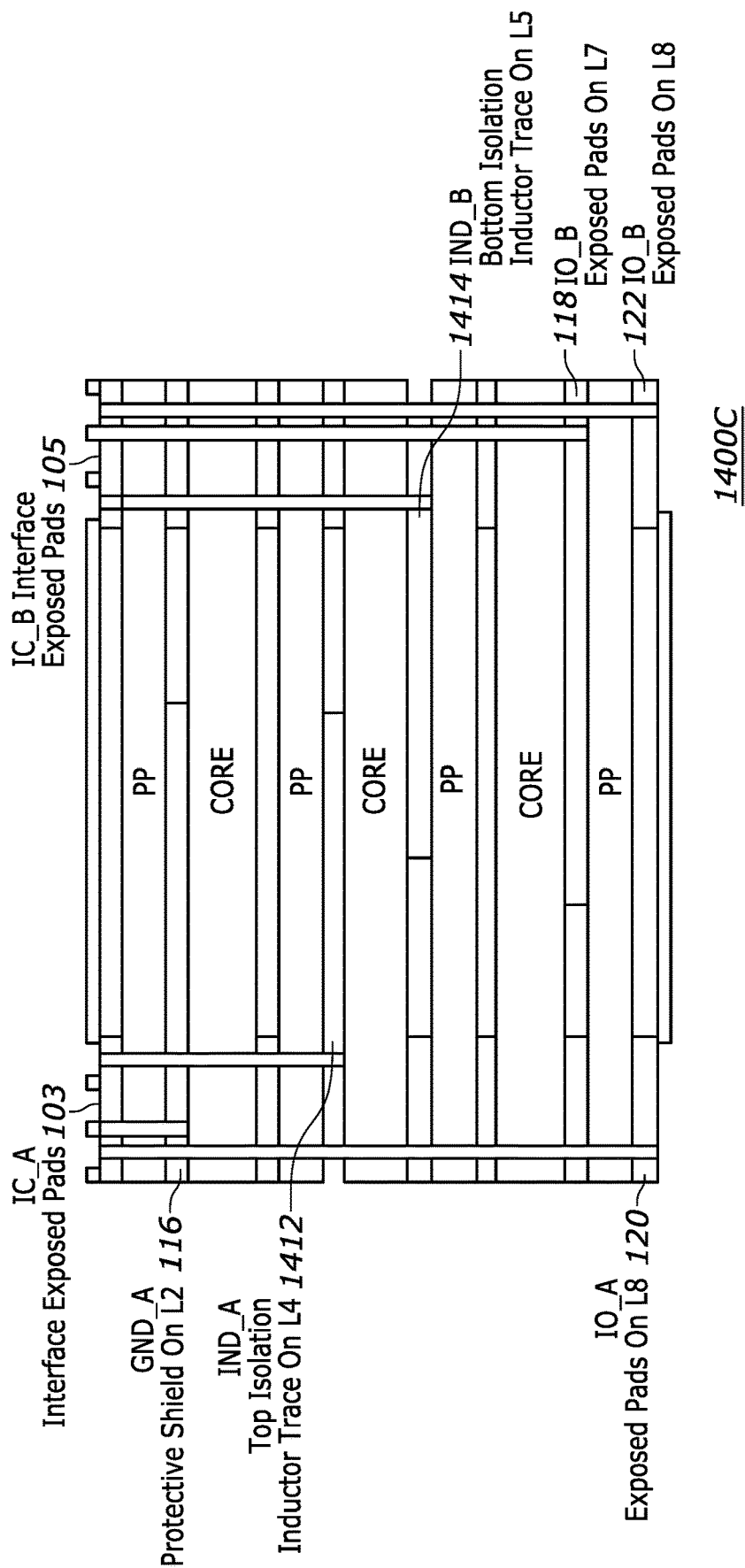
FIG. 14C depicts a cross-sectional view of components in the physical structure of the galvanic isolation device implemented on a an 8-layer printed circuit board.

In another embodiment, IC_A 102 and IC_B 104 can be coupled together through isolated inductors instead of isolated capacitors. The CAP_A and CAP_B capacitor plates 112 and 114 described herein can be replaced by IND_A and IND_B inductor/inductive loops 1412 and 1414 as depicted in FIGS. 14A-14C. Similar to capacitive coupling using CAP_A and CAP_B capacitor plates 112 and 114, inductive coupling between IC_A and IC_B is formed by overlapping IND_A and IND_B inductor loops 1412 and 1414.

FIG. 14A depicts a top view 1400A of components in the physical structure of the galvanic isolation system without the IC devices, IC_A and IC_B, attached. The system of FIG. 14A includes IC_A interface 103, IND_A isolation inductor loop/trace 1412, GND_A protective shield 116, IO_A exposed pads 120, IC_B interface 105, IND_B isolation inductor loop/trace 1414, GND_B protective shield 118, and IO_B exposed pads 122.

FIG. 14B depicts a cross-sectional view 1400B of components in the physical structure of the galvanic isolation device implemented on a 4-layer printed circuit board and FIG. 14C depicts a cross-sectional view 1400C of components in the physical structure of the galvanic isolation device implemented on a an 8-layer printed circuit board. The components of FIG. 14B include IC_A interface 103, GND_A protective shield 116 on layer 1 (L1), IND_A isolation top inductor loop/trace 1412 on layer 2 (L2), IO_A exposed pads 120 on layer 4 (L4), IC_B interface 105, IND_B isolation bottom inductor loop/trace 1414 on layer 3 (L3), GND_B protective shield 118 on L4, IO_B exposed pads 122 on L4, vias, and solder masks. The components of FIG. 14C include IC_A interface 103, GND_A protective shield 116 on L2, IND_A isolation top inductor loop/trace 1412 on L4, IO_A exposed pads 120 on layer 8 (L8), IC_B interface 105, IND_B isolation bottom inductor loop/trace 1414 on layer 5 (L5), GND_B protective shield 118 on layer 7 (L7), IO_B exposed pads 122 on L8, vias, and solder masks.

Figure 15A:
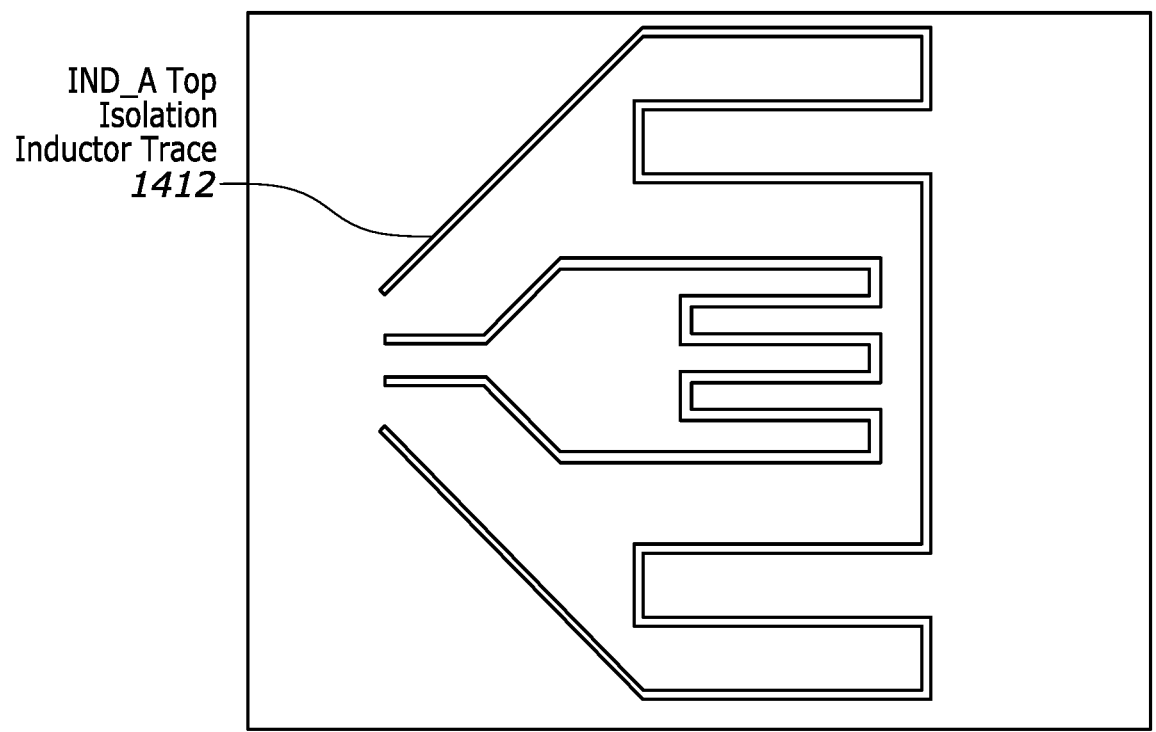
FIG. 15A depicts a top view of the IND_A component in the physical structure of the galvanic isolation device that includes IND_A isolation top inductor loop/trace.
Figure 15B:
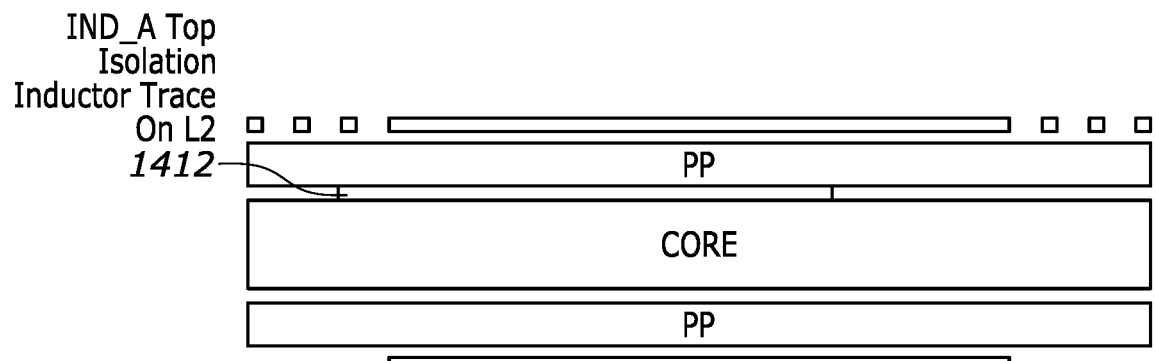
FIG. 15B depicts a cross-sectional view of the IND_A component in the physical structure of the galvanic isolation device implemented on a 4-layer printed circuit board.
Figure 15C:
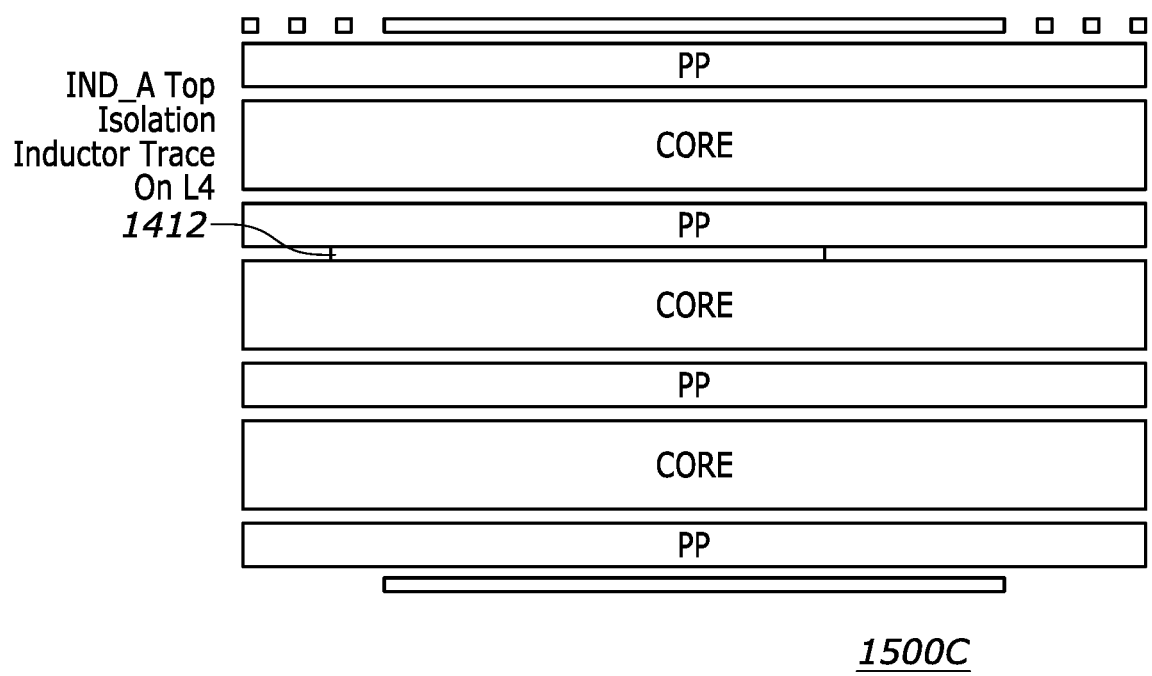
FIG. 15C depicts a cross-sectional view of the IND_A component in the physical structure of the galvanic isolation device implemented on an 8-layer printed circuit board.

FIGS. 15A-15C highlight the IND_A component in the physical structure of the galvanic isolation device. FIG. 15A depicts a top view 1500A of the IND_A component in the physical structure of the galvanic isolation device that includes IND_A isolation top inductor loop/trace 1412. FIG. 15B depicts a cross-sectional view 1500B of the IND_A component in the physical structure of the galvanic isolation device implemented on a 4-layer printed circuit board and FIG. 15C depicts a cross-sectional view 1500C of the IND_A component in the physical structure of the galvanic isolation device implemented on an 8-layer printed circuit board.

Figure 16A:
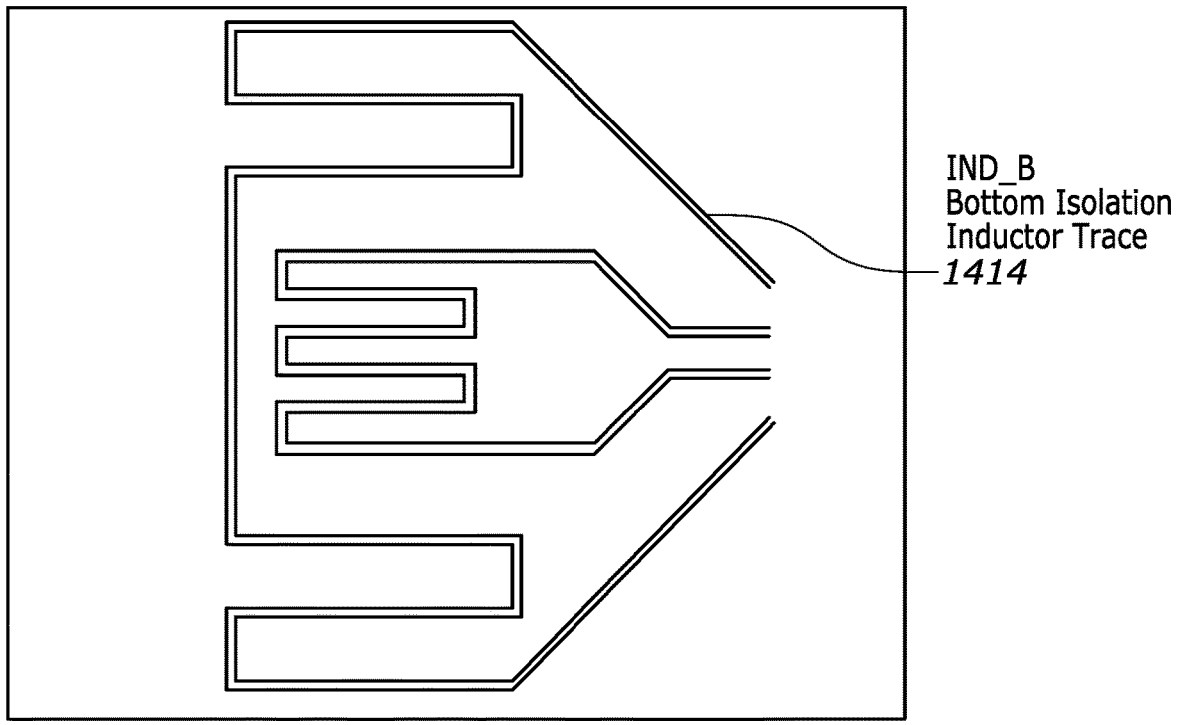
FIG. 16A depicts a top view of the IND_B component in the physical structure of the galvanic isolation device that includes IND_B isolation top inductor loop/trace.
Figure 16B:
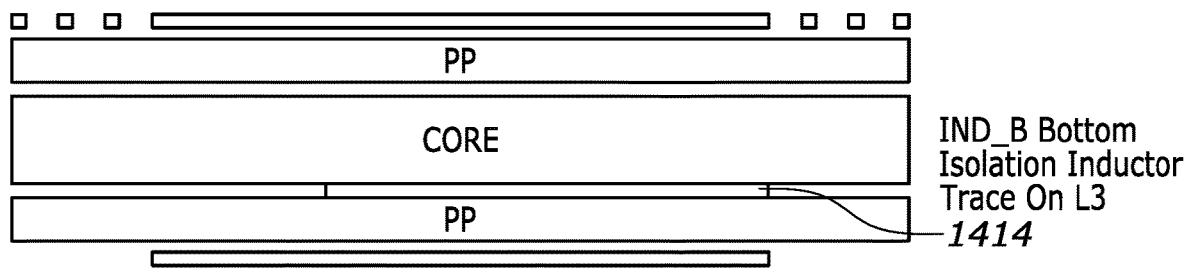
FIG. 16B depicts a cross-sectional view of the IND_B component in the physical structure of the galvanic isolation device implemented on a 4-layer printed circuit board.
Figure 16C:
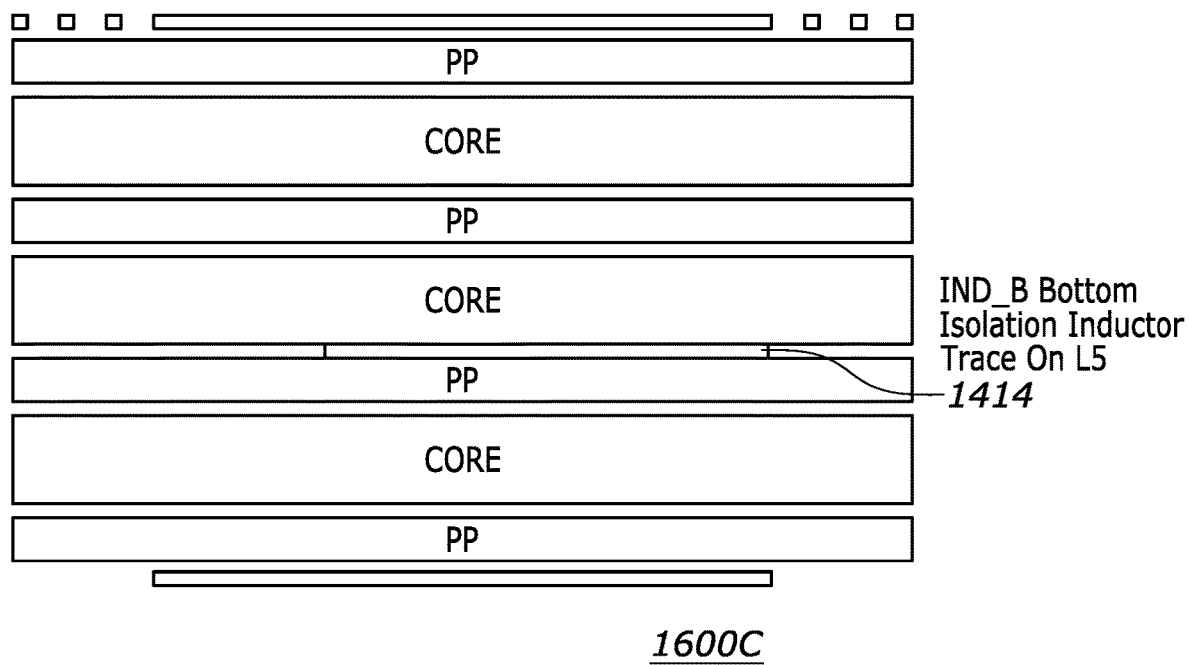
FIG. 16C depicts a cross-sectional view of the IND_B component in the physical structure of the galvanic isolation device implemented on an 8-layer printed circuit board.

FIGS. 16A-16C highlight the IND_B component in the physical structure of the galvanic isolation device. FIG. 16A depicts a top view 1600A of the IND_B component in the physical structure of the galvanic isolation device that includes IND_B isolation top inductor loop/trace 1414. FIG. 16B depicts a cross-sectional view 1600B of the IND_B component in the physical structure of the galvanic isolation device implemented on a 4-layer printed circuit board and FIG. 16C depicts a cross-sectional view 1600C of the IND_B component in the physical structure of the galvanic isolation device implemented on an 8-layer printed circuit board.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A device for galvanic isolation, the device comprising:
a first integrated circuit (IC) device interface;
first input/output components connected to the first IC device interface;
a second IC device interface;
second input/output components connected to the second IC device interface;
an insulator layer having a first major surface and a second major surface;
at least one pair of capacitor plates and corresponding interconnection paths on the first major surface, wherein the interconnection paths are electrically connected to the first IC device interface by plate-specific vias; and
at least one pair of capacitor plates and corresponding interconnection paths on the second major surface, wherein the interconnection paths are electrically connected to the second IC device interface by plate-specific vias;
wherein the at least one pair of capacitor plates on the first major surface of the insulator layer are aligned with the at least one pair of capacitor plates on the second major surface of the insulator layer to form at least one pair of capacitors.

2. The device of claim 1, wherein:
the first input/output components are connected to the first IC device interface by vias; and
the second input/output components are connected to the second IC device interface by vias.

3. The device of claim 1, further comprising:
a first ground plate separated from the at least one pair of capacitor plates and corresponding interconnection paths on the first major surface by a protective shield insulator layer, and connected to the first IC device interface; and
a second ground plate separated from the at least one pair of capacitor plates and corresponding interconnection paths on the second major surface by a protective shield insulator layer, and connected to the second IC device interface.

4. The device of claim 1, wherein the first IC device interface is on a first side of a top surface of the device and the second IC device interface is on a second side of the top surface of the device, and wherein the first side of the device is opposite the second side of the device.

5. The device of claim 1, wherein:
the first IC device interface and the first input/output components are on opposite surfaces of the device; and
the second IC device interface and the second input/output components are on opposite surfaces of the device.

6. The device of claim 5, wherein:
the first IC device interface and the second IC device are on the same surface of the device; and
the first input/output components and the second input/output components are on the same surface of the device.

7. The device of claim 1, wherein:
the first IC device interface and the second IC device are on a top surface of the device; and
the first input/output components and the second input/output components are on a bottom surface of the device.

8. A device for galvanic isolation, the device comprising:
a first integrated circuit (IC) device interface;
first input/output components connected to the first IC device interface;
a second IC device interface;
second input/output components connected to the second IC device interface;
an insulator layer having a first major surface and a second major surface;
at least one pair of conductive elements and corresponding interconnection paths on the first major surface, wherein the interconnection paths are electrically connected to the first IC device interface by plate-specific vias; and
at least one pair of conductive elements and corresponding interconnection paths on the second major surface, wherein the interconnection paths are electrically connected to the second IC device interface by plate-specific vias;
wherein the at least one pair of conductive elements on the first major surface of the insulator layer are aligned with the at least one pair of conductive elements on the second major surface of the insulator layer to form at least one pair of couplers.

9. The device of claim 8, wherein:
the at least one pair of conductive elements on the first major surface is a pair of inductive loops; and
the at least one pair of conductive elements on the second major surface is a pair of inductive loops.

10. The device of claim 8, wherein:
the first IC device interface and the second IC device are on a top surface of the device; and
the first input/output components and the second input/output components are on a bottom surface of the device.

11. The device of claim 8, wherein:
the first input/output components are connected to the first IC device interface by vias; and
the second input/output components are connected to the second IC device interface by vias.

12. The device of claim 8, further comprising:
a first ground plate separated from the at least one pair of conductive elements and corresponding interconnection paths on the first major surface by a protective shield insulator layer, and connected to the first IC device interface; and
a second ground plate separated from the at least one pair of conductive elements and corresponding interconnection paths on the second major surface by a protective shield insulator layer, and connected to the second IC device interface.

13. The device of claim 8, wherein the first IC device interface is on a first side of a top surface of the device and the second IC device interface is on a second side of the top surface of the device, and wherein the first side of the device is opposite the second side of the device.

14. The device of claim 8, wherein:
the first IC device interface and the first input/output components are on opposite surfaces of the device; and
the second IC device interface and the second input/output components are on opposite surfaces of the device.

15. The device of claim 13, wherein:
the first IC device interface and the second IC device are on the same surface of the device; and
the first input/output components and the second input/output components are on the same surface of the device.

16. A system for serial communication, the system comprising:
a galvanic isolation device;
a first integrated circuit (IC) device connected to the galvanic isolation device; and
a second IC device connected to the galvanic isolation device;
wherein the galvanic isolation device includes;
first input/output components connected to the first IC device;
second input/output components connected to the second IC device;
an insulator layer having a first major surface and a second major surface;
at least one pair of conductive elements and corresponding interconnection paths on the first major surface, wherein the interconnection paths are electrically connected to the first IC device by plate-specific vias; and
at least one pair of conductive elements and corresponding interconnection paths on the second major surface, wherein the interconnection paths are electrically connected to the second IC device by plate-specific vias;
wherein the at least one pair of conductive elements on the first major surface of the insulator layer are aligned with the at least one pair of conductive elements on the second major surface of the insulator layer to form at least one pair of couplers.

* * * * *